United States Patent
Nien et al.

(10) Patent No.: US 12,125,523 B2
(45) Date of Patent: Oct. 22, 2024

(54) MEMORY DEVICE AND METHOD OF MANUFACTURING THE SAME

(71) Applicant: TAIWAN SEMICONDUCTOR MANUFACTURING COMPANY, LTD., Hsinchu (TW)

(72) Inventors: Yi-Hsin Nien, Hsinchu (TW); Hidehiro Fujiwara, Hsinchu (TW); Chih-Yu Lin, Taichung (TW); Yen-Huei Chen, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 170 days.

(21) Appl. No.: 17/585,824

(22) Filed: Jan. 27, 2022

(65) Prior Publication Data

US 2023/0238056 A1    Jul. 27, 2023

(51) Int. Cl.
*G11C 11/412*    (2006.01)
*G11C 11/419*    (2006.01)
*H10B 10/00*    (2023.01)

(52) U.S. Cl.
CPC .......... *G11C 11/412* (2013.01); *G11C 11/419* (2013.01); *H10B 10/12* (2023.02)

(58) Field of Classification Search
CPC ....... G11C 11/412; G11C 11/419; G11C 8/16; H10B 10/12
USPC .............................................. 365/154, 185.24
See application file for complete search history.

(56) References Cited

U.S. PATENT DOCUMENTS

| | | | | |
|---|---|---|---|---|
| 6,483,749 B1 * | 11/2002 | Choi | ...................... | H10B 41/40 365/185.27 |
| 9,082,500 B1 * | 7/2015 | Ku | ......................... | G11C 16/26 |
| 11,049,539 B1 * | 6/2021 | Sanjeevarao | ....... | G11C 11/1655 |
| 11,126,550 B1 * | 9/2021 | Yeung | ................. | G06F 12/0802 |
| 11,164,623 B1 * | 11/2021 | Nakamura | .......... | G11C 11/4094 |
| 2009/0046495 A1 * | 2/2009 | Shimaoka | .......... | G11C 13/0069 365/189.16 |
| 2012/0069636 A1 * | 3/2012 | Pelley | .................... | G11C 11/413 365/210.1 |
| 2013/0088925 A1 * | 4/2013 | Chang | ................... | G11C 11/412 365/189.03 |

(Continued)

FOREIGN PATENT DOCUMENTS

| | | | | |
|---|---|---|---|---|
| CN | 107403644 B | * | 1/2020 | ............. G11C 16/22 |
| WO | WO-2015037088 A1 | * | 3/2015 | ......... G11C 11/5642 |

*Primary Examiner* — Michael T Tran
(74) *Attorney, Agent, or Firm* — Birch, Stewart, Kolasch & Birch, LLP

(57) ABSTRACT

A memory device includes a conductive segment, first and second rows of memory cells. The conductive segment receives a first reference voltage signal. The first row of memory cells is coupled to a first word line. The second row of memory cells is coupled to a second word line. The first row of memory cells includes first and second memory cells. The first memory cell is coupled to the conductive segment to receive the first reference voltage signal. The second row of memory cells includes third and fourth memory cells. The third memory cell is coupled to the conductive segment to receive the first reference voltage signal. The first and third memory cells share the conductive segment, and the third memory cell is arranged between the first and second memory cells. The second memory cell is arranged between the third and fourth memory cells.

20 Claims, 10 Drawing Sheets

(56) References Cited

U.S. PATENT DOCUMENTS

| | | | |
|---|---|---|---|
| 2014/0198571 A1* | 7/2014 | Wu | G11C 16/14 |
| | | | 365/185.05 |
| 2018/0342298 A1* | 11/2018 | Goda | G11C 16/0483 |
| 2019/0067206 A1* | 2/2019 | Bedeschi | G11C 11/2253 |
| 2019/0238135 A1* | 8/2019 | Lin | G11C 14/0081 |
| 2020/0075074 A1* | 3/2020 | Chiang | G11C 11/1659 |
| 2020/0082880 A1* | 3/2020 | Inuzuka | G11C 13/003 |
| 2020/0152249 A1* | 5/2020 | Kawamura | G11C 7/06 |
| 2020/0176033 A1* | 6/2020 | Hosotani | G11C 16/0483 |
| 2021/0074349 A1* | 3/2021 | Kim | G06N 3/063 |
| 2021/0074915 A1* | 3/2021 | Tsukamoto | H10B 63/80 |
| 2021/0110873 A1* | 4/2021 | Liang | G11C 16/10 |
| 2021/0217454 A1* | 7/2021 | Ocker | G11C 11/2273 |
| 2021/0272971 A1* | 9/2021 | Li | H10B 20/20 |
| 2021/0312969 A1* | 10/2021 | Noack | G11C 11/2257 |
| 2021/0335402 A1* | 10/2021 | Lan | G11C 11/409 |
| 2021/0357155 A1* | 11/2021 | You | G06F 3/0634 |
| 2021/0358549 A1* | 11/2021 | Vimercati | G11C 16/045 |
| 2022/0285367 A1* | 9/2022 | Fackenthal | G11C 11/412 |
| 2022/0319602 A1* | 10/2022 | Lee | H10B 43/27 |
| 2022/0319629 A1* | 10/2022 | Ciocchini | G11C 29/44 |
| 2022/0328088 A1* | 10/2022 | Sakui | G11C 16/02 |

\* cited by examiner

MEMORY DEVICE AND METHOD OF MANUFACTURING THE SAME

BACKGROUND

A memory device includes memory cells for storing data. The memory cells are typically arranged in rows. Each of the memory cells is coupled to a corresponding word line. When a read operation is performed to a memory cell row, a word line signal is applied to a corresponding word line, such that the memory cell row is activated to generate corresponding data signals.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
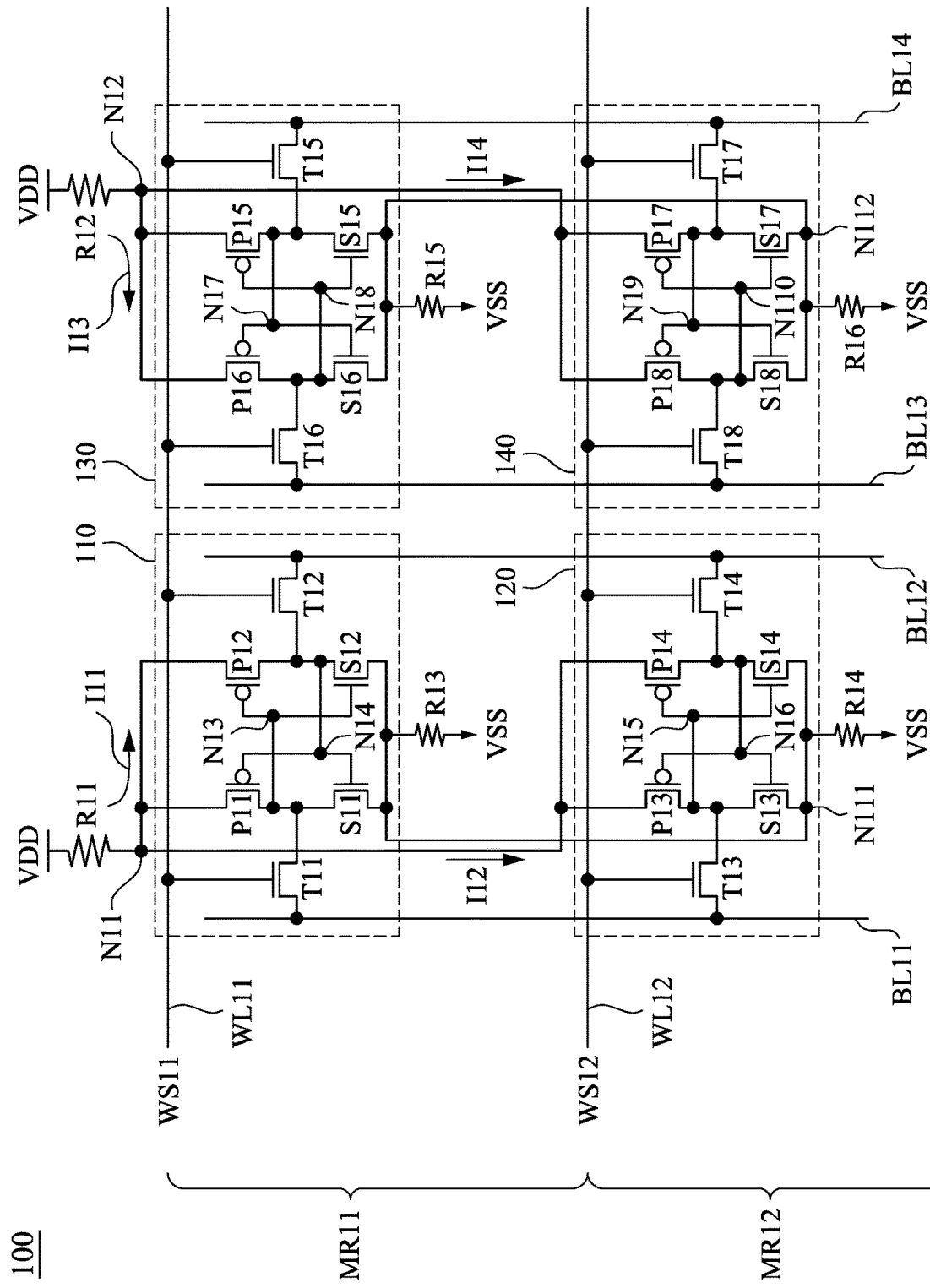
FIG. 1 is a circuit diagram of a memory device 100 in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. The term mask, photolithographic mask, photomask and reticle are used to refer to the same item.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

FIG. 1 is a circuit diagram of a memory device 100 in accordance with some embodiments of the present disclosure. As illustratively shown in FIG. 1, the memory device 100 includes memory cell rows MR11 and MR12. In some embodiments, the memory cell rows MR11 and MR12 are configured to be activated based on word line signals WS11 and WS12, respectively. In some embodiments, the memory cell rows MR12 and MR11 are activated in order, and generate data signals when activated. In some embodiments, the memory cell row MR11 corresponds to an (N+1)th row of a memory array, the memory cell row MR12 corresponds to an Nth row of the memory array. It is noted that N is a positive integer.

In some embodiments, the memory cell row MR11 includes a memory cell 110 and a word line WL11. In some embodiments, the memory cell 110 is configured to receive the word line signal WS11 through the word line WL11. In some embodiments, the memory cell row MR12 includes a memory cell 120 and a word line WL12. In some embodiments, the memory cell 120 is configured to receive the word line signal WS12 through the word line WL12.

As illustratively shown in FIG. 1, the memory cells 110 and 120 are coupled to each other at a node N11. In some embodiments, each of the memory cells 110 and 120 are configured to receive reference voltage signals VDD and VSS. In some embodiments, a voltage level of the reference voltage signal VDD is higher than a voltage level of the reference voltage signal VSS.

In some embodiments, the memory 100 further includes a resistor R11. As illustratively shown in FIG. 1, a terminal of the resistor R11 is coupled to the node N11, another terminal of the resistor R11 is configured to receive the reference voltage signal VDD.

In some embodiments, the memory 100 further includes resistors R13 and R14. As illustratively shown in FIG. 1, the resistors R13 and R14 are configured to transmit the reference voltage signal VSS to the memory cells 110 and 120, respectively. In some embodiments, a current I11 passes through the resistor R11, the node N11 and the memory cell 110 in order, and a current I12 passes through the resistor R11, the node N11 and the memory cell 120 in order.

In some embodiments, when one of the memory cells 110 and 120 is activated, a corresponding one of the currents I11 and I12 has an access current level ICS. When one of the memory cells 110 and 120 is deactivated, a corresponding one of the currents I11 and I12 has a leakage current level ILK. In some embodiments, the leakage current level ILK is much smaller than the access current level ICS.

In some embodiments, in response to the word line signal WS12 has an enable voltage level and the word line signal WS11 has a disable voltage level, the memory cells 120 is activated and the memory cell 110 is deactivated. Accordingly, the current I12 has the access current level ICS and the current I11 has the leakage current level ILK. At this moment, the node N11 has a voltage level CDD=DD−RV1× ICS−RV1×ILK. In which the reference voltage signal VDD has the voltage level DD, and the resistor R11 has the resistance RV1.

In some embodiments, after the memory cell 120 is activated, the word line signal WS11 has the enable voltage level and the word line signal WS12 has the disable voltage level, such that the memory cell 110 is activated and the memory cell 120 is deactivated. Accordingly, the current I11 have the access current level ICS and the current I12 has the leakage current level ILK. At this moment, the node N11 has the voltage level CDD.

In some approaches, memory cells in a same row receive a reference voltage signal through a resistor. When the memory cells are activated, currents passing through the memory cells have an access current level. As a result, a voltage drop of the reference voltage signal due to the resistor and the currents are large.

Compared to the above approaches, in some embodiments of the present disclosure, the memory cell 110 and 120 in different memory cell rows MR11 and MR12 receive the reference voltage signal VDD through the resistor R11. One of the memory cell rows MR11 and MR12 is activated when another one of the memory cell rows MR11 and MR12 is deactivated, such that one of the currents I11 and I12 has the leakage current level ILK. As a result, a voltage drop of the reference voltage signal VDD due to the resistor R11 and the currents I11 and I12 is reduced.

In some embodiments, the memory cell 110 includes switches P11, P12, S11, S12, T11 and T12. As illustratively shown in FIG. 1, a terminal of the switch P11 is coupled to the node N11, another terminal of the switch P11 is coupled to a node N13, a control terminal of the switch P11 is coupled to a node N14. A terminal of the switch P12 is coupled to the node N11, another terminal of the switch P12 is coupled to the node N14, a control terminal of the switch P12 is coupled to a node N13. A terminal of the switch S11 is coupled to the node N13, another terminal of the switch S11 is coupled to the resistor R13 at a node N111, a control terminal of the switch S11 is coupled to the node N14. A terminal of the switch S12 is coupled to the node N14, another terminal of the switch S12 is coupled to the node N111, a control terminal of the switch S12 is coupled to the node N13. A terminal of the switch T11 is coupled to the node N13, another terminal of the switch T11 is coupled to a bit line BL11, a control terminal of the switch T11 is coupled to the word line WL11. A terminal of the switch T12 is coupled to the node N14, another terminal of the switch T12 is coupled to a bit line BL12, a control terminal of the switch T12 is coupled to the word line WL11.

In some embodiments, the memory cell 120 includes switches P13, P14, S13, S14, T13 and T14. As illustratively shown in FIG. 1, a terminal of the switch P13 is coupled to the node N15, another terminal of the switch P13 is coupled to the node N11, a control terminal of the switch P13 is coupled to a node N16. A terminal of the switch P14 is coupled to the node N11, another terminal of the switch P14 is coupled to the node N16, a control terminal of the switch P14 is coupled to a node N15. A terminal of the switch S13 is coupled to the node N15, another terminal of the switch S13 is coupled to the resistor R14 at a node N111, a control terminal of the switch S13 is coupled to the node N16. A terminal of the switch S14 is coupled to the node N16, another terminal of the switch S14 is coupled to the node N111, a control terminal of the switch S14 is coupled to the node N15. A terminal of the switch T13 is coupled to the node N15, another terminal of the switch T13 is coupled to the bit line BL11, a control terminal of the switch T13 is coupled to the word line WL12. A terminal of the switch T14 is coupled to the node N16, another terminal of the switch T14 is coupled to the bit line BL12, a control terminal of the switch T14 is coupled to the word line WL12.

In some embodiments, the memory cell row MR11 further includes a memory cell 130. In some embodiments, the memory cell 130 is configured to receive the word line signal WS11 through the word line WL11. In some embodiments, the memory cell row MR12 includes a memory cell 140. In some embodiments, the memory cell 140 is configured to receive the word line signal WS12 through the word line WL12.

As illustratively shown in FIG. 1, the memory cells 130 and 140 are coupled to each other at a node N12. In some embodiments, each of the memory cells 130 and 140 are configured to receive reference voltage signals VDD and VSS. In some embodiments, the memory 100 further includes a resistor R12. As illustratively shown in FIG. 1, a terminal of the resistor R12 is coupled to the node N12, another terminal of the resistor R12 is configured to receive the reference voltage signal VDD.

In some embodiments, the memory 100 further includes resistors R15 and R16. As illustratively shown in FIG. 1, the resistors R15 and R16 are configured to transmit the reference voltage signal VSS to the memory cells 130 and 140, respectively. In some embodiments, a current I13 passes through the resistor R12, the node N12 and the memory cell 130 in order, and a current I14 passes through the resistor R12, the node N12 and the memory cell 140 in order.

In some embodiments, when one of the memory cells 130 and 140 is activated, a corresponding one of the currents I13 and I14 has an access current level ICS. When one of the memory cells 130 and 140 is deactivated, a corresponding one of the currents I13 and I14 has a leakage current level ILK.

In some embodiments, in response to the word line signal WS12 has an enable voltage level and the word line signal WS11 has a disable voltage level, the memory cells 140 is activated and the memory cell 130 is deactivated. Accordingly, the current I14 has the access current level ICS and the current I13 has the leakage current level ILK. At this moment, the node N12 has a voltage level CDD=DD-RV1× ICS-RV1×ILK. In which the resistor R12 has the resistance RV1.

In some embodiments, after the memory cell 140 is activated, the word line signal WS11 has the enable voltage level and the word line signal WS12 has the disable voltage level, such that the memory cell 130 is activated and the memory cell 140 is deactivated. Accordingly, the current I13 have the access current level ICS and the current I14 has the leakage current level ILK. At this moment, the node N12 has the voltage level CDD.

In some embodiments, the memory cell 130 includes switches P15, P16, S15, S16, T15 and T16. As illustratively shown in FIG. 1, a terminal of the switch P15 is coupled to the node N17, another terminal of the switch P15 is coupled to the node N12, a control terminal of the switch P15 is coupled to a node N18. A terminal of the switch P16 is coupled to the node N12, another terminal of the switch P16 is coupled to the node N18, a control terminal of the switch P16 is coupled to a node N17. A terminal of the switch S15 is coupled to the node N17, another terminal of the switch S15 is coupled to the resistor R15 at a node N112, a control terminal of the switch S15 is coupled to the node N18. A terminal of the switch S16 is coupled to the node N18, another terminal of the switch S16 is coupled to the node N112, a control terminal of the switch S16 is coupled to the node N17. A terminal of the switch T15 is coupled to the node N17, another terminal of the switch T15 is coupled to the bit line BL14, a control terminal of the switch T15 is coupled to the word line WL11. A terminal of the switch T16 is coupled to the node N18, another terminal of the switch T16 is coupled to the bit line BL13, a control terminal of the switch T16 is coupled to the word line WL11.

In some embodiments, the memory cell 140 includes switches P17, P18, S17, S18, T17 and T18. As illustratively shown in FIG. 1, a terminal of the switch P17 is coupled to the node N19, another terminal of the switch P17 is coupled to the node N12, a control terminal of the switch P17 is coupled to a node N110. A terminal of the switch P18 is coupled to the node N12, another terminal of the switch P18 is coupled to the node N110, a control terminal of the switch P18 is coupled to a node N19. A terminal of the switch S17 is coupled to the node N19, another terminal of the switch S17 is coupled to the resistor R16 at a node N112, a control terminal of the switch S17 is coupled to the node N110. A terminal of the switch S18 is coupled to the node N110, another terminal of the switch S18 is coupled to the node N112, a control terminal of the switch S18 is coupled to the node N19. A terminal of the switch T17 is coupled to the node N19, another terminal of the switch T17 is coupled to the bit line BL14, a control terminal of the switch T17 is coupled to the word line WL12. A terminal of the switch T18 is coupled to the node N110, another terminal of the switch T18 is coupled to the bit line BL13, a control terminal of the switch T18 is coupled to the word line WL12.

In some embodiments, the switches P11-P18 are implemented as P-type Metal-Oxide-Semiconductor (PMOS) transistors, and the switches S11-S18 and T11-T18 are implemented as N-type Metal-Oxide-Semiconductor (NMOS) transistors.

Figures 2A, 2B:
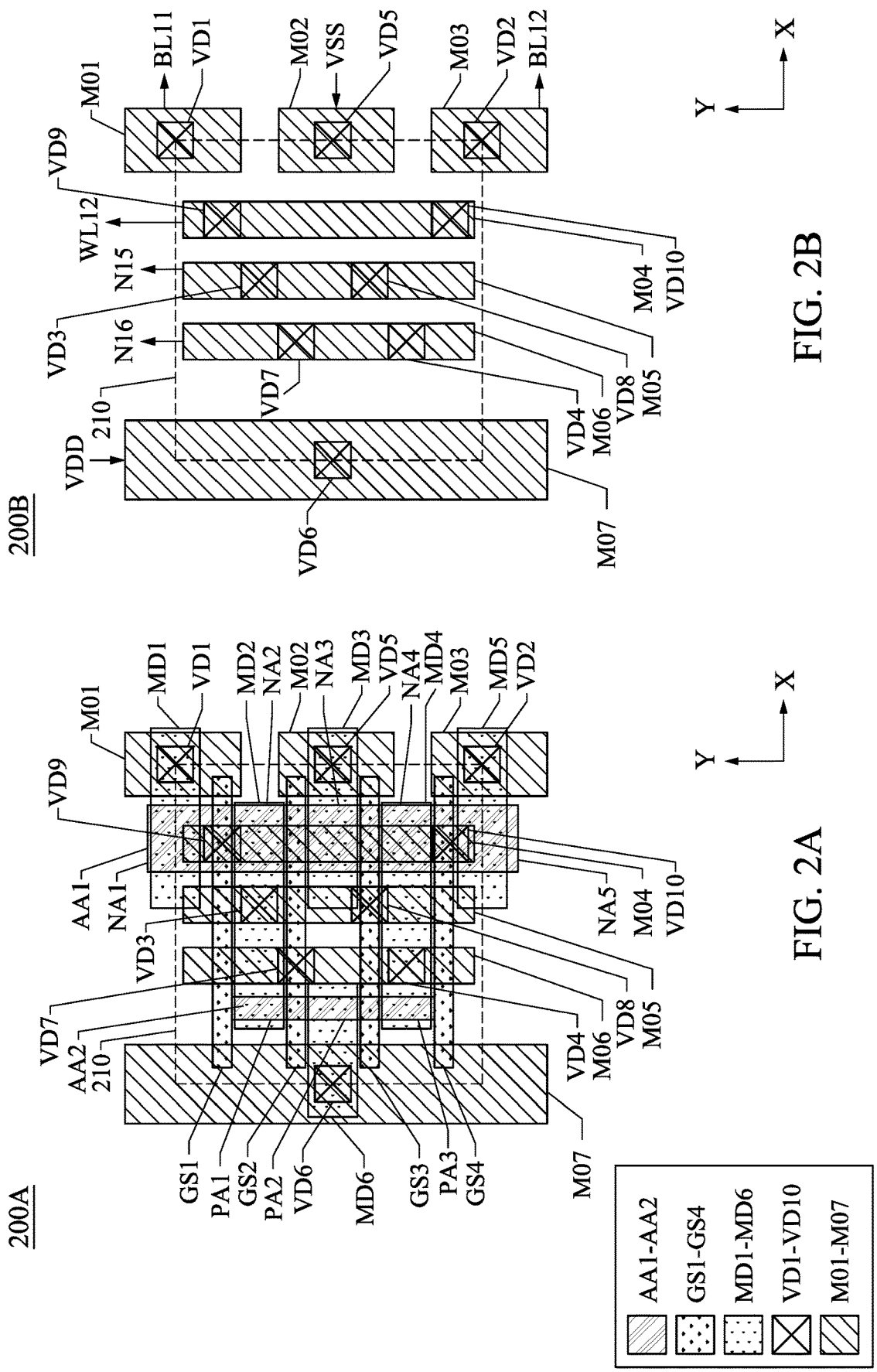
FIG. 2A is a schematic layout of an integrated circuit including structures corresponding to a portion of the memory device shown in FIG. 1, in accordance with some embodiments of the present disclosure.
FIG. 2B is a schematic layout of an integrated circuit including structures corresponding to a portion of the memory device shown in FIG. 1, in accordance with some embodiments of the present disclosure.

FIG. 2A is a schematic layout 200A of an integrated circuit including structures corresponding to a portion of the memory device 100 shown in FIG. 1, in accordance with some embodiments of the present disclosure. For simplicity of illustration, the schematic layout 200A only shows a portion of structures, and the other portion of structures as can be known by one of ordinary skill in the art is not detailed in FIG. 2A.

As illustratively shown in FIG. 2A, the schematic layout 200A includes memory cell 210. For illustration of FIG. 2A with reference to FIG. 1, the memory cell 210 corresponds to the memory cell 120. In some embodiments, each of the memory cells 110, 130 and 140 has a structure similar with the memory cell 210.

As illustratively shown in FIG. 2A, the memory cell 210 includes active areas AA1, AA2 and gate structures GS1-GS4. The schematic layout 200A further includes conductive segments MD1-MD6, M01-M07. In some embodiments, the active areas AA1, AA2 and the conductive segments M01-M07 extend in, for example, a Y direction, and the gate structures GS1-GS4 and the conductive segments MD1-MD6 extend in, for example, an X direction different from the Y direction.

As illustratively shown in FIG. 2A, the gate structures GS2 and GS3 are crossing over the active areas AA1 and AA2. The gate structures GS1, GS4 and the conductive segments MD1-MD5 are crossing over the active area AA1. The conductive segments MD2, MD4 and MD6 are crossing over the active area AA2. The conductive segments M01 is crossing over the conductive segment MD1. The conductive segments M02 is crossing over the conductive segment MD3. The conductive segments M03 is crossing over the conductive segment MD5. The conductive segment M04 is crossing over the conductive segments MD1-MD5 and the gate structures GS1-GS4. Each of the conductive segments M05 and M06 is crossing over the conductive segments MD2, MD4 and the gate structures GS1-GS4. The conductive segment M07 is crossing over the conductive segment MD6.

In some embodiments, the active areas AA1, AA2 are formed by using semiconductor material to be doped regions. In some embodiments, the active areas AA1, AA2 are formed as a part of gate-all-around (GAA) nanosheet transistors. In some embodiments, the gate structures GS1-GS4 are implemented by polysilicon, metal, doped polysilicon, or other suitable material. In some embodiments, the conductive segments MD1-MD6, M01-M07 are implemented by metal or other suitable material. In some embodiments, fin structures including the gate structures GS1-GS4 are formed over the active areas AA1 and AA2, to form Fin Field-Effect Transistors (FinFETs).

In some embodiments, each one of the active areas AA1, AA2 has at least one doped region corresponding to a source or a drain of a transistor. As illustratively shown in FIG. 2A, the active area AA1 includes doped regions NA1-NA5, and the active area AA2 includes doped regions PA1-PA3.

In some embodiments, the gate structures GS1-GS4 are arranged for forming the switches P13, P14, S13, S14, T13 and T14 in FIG. 1. As illustratively shown in FIG. 2A, the doped regions NA1 and NA2 are placed at two opposite sides of the gate structure GS1. The doped regions NA2 and NA3 are placed at two opposite sides of the gate structure GS2. The doped regions NA3 and NA4 are placed at two opposite sides of the gate structure GS3. The doped regions NA4 and NA5 are placed at two opposite sides of the gate structure GS4. The doped regions PA1 and PA2 are placed at two opposite sides of the gate structure GS2. The doped regions PA2 and PA3 are placed at two opposite sides of the gate structure GS3.

For illustration of FIG. 2A with reference to FIG. 1, the doped regions NA1 and NA2 of the active area AA1 together with the gate structure GS1 correspond to the switch T13. The doped regions NA3 and NA2 of the active area AA1 together with the gate structure GS2 correspond to the switch S13. The doped regions NA3 and NA4 of the active area AA1 together with the gate structure GS3 correspond to the switch S14. The doped regions NA4 and NA5 of the active area AA1 together with the gate structure GS4 correspond to the switch T14. The doped regions PA1 and PA2 of the active area AA2 together with the gate structure GS2 correspond to the switch P13. The doped regions PA3 and PA2 of the active area AA2 together with the gate structure GS3 correspond to the switch P14.

For illustration of FIG. 2A with reference to FIG. 1, in some embodiments, the doped region NA1 corresponds to a drain of the switch T13 and is coupled to the conductive segment M01, which is coupled to the bit line BL11, through the conductive segment MD1 and VD1. The doped region NA5 corresponds to a drain of the switch T14 and is coupled to the conductive segment M03, which is coupled to the bit line BL12, through the conductive segment MD5 and VD2.

For illustration of FIG. 2A with reference to FIG. 1, in some embodiments, the doped region PA1 corresponds to a drain of the switch P13 and is coupled to the doped region NA2 through the conductive segment MD2. The doped region NA2 is shared by sources of the switches T13 and S13. The conductive segment MD2 is coupled to the conductive segment M05, which corresponds to the node N15, through a via VD3. The doped region PA3 corresponds to a drain of the switch P14 and is coupled to the doped region NA4 through the conductive segment MD4. The doped region NA4 is shared by sources of the switches T14 and S14. The conductive segment MD4 is coupled to the conductive segment M06, which corresponds to the node N16, through a via VD4.

For illustration of FIG. 2A with reference to FIG. 1, in some embodiments, the doped region NA3 is shared by drains of the switches S14 and S13, and is coupled to the conductive segment M02 through the conductive segment MD3 and a via VD5. In some embodiments, the conductive segment M02 is configured to receive the reference voltage signal VSS. For illustration of FIG. 2A with reference to FIG. 1, the conductive segment MD3 corresponds to the node N111, and the resistor R14 is an equivalent resistor of at least the conductive segment M02 and a via VD5.

For illustration of FIG. 2A with reference to FIG. 1, in some embodiments, the doped region PA2 is shared by sources of the switches P14 and P13, and is coupled to the conductive segment M07 through the conductive segment MD6 and a via VD6. In some embodiments, the conductive segment M07 is configured to receive the reference voltage signal VDD. For illustration of FIG. 2A with reference to FIG. 1, the conductive segment MD6 corresponds to the node N11, and the resistor R11 is an equivalent resistor of at least the conductive segment M07 and a via VD6.

As illustratively shown in FIG. 2A, the gate structure GS2 is coupled to conductive segment M06 through a via VD7. The gate structure GS1 is coupled to the conductive segment M04 through a via VD9. The gate structure GS3 is coupled to conductive segment M05 through a via VD8. The gate structure GS4 is coupled to the conductive segment M04 through a via VD10. For illustration of FIG. 2A with reference to FIG. 1, in some embodiments, the conductive segment M04 is coupled to the word line WL12.

FIG. 2B is a schematic layout 200B of an integrated circuit including structures corresponding to a portion of the memory device 100 shown in FIG. 1, in accordance with some embodiments of the present disclosure. For illustration of FIG. 2B with reference to FIG. 2A, the schematic layout 200B shows the conductive segments M01-M07 and the vias VD1-VD10 for clarity.

Figure 3:
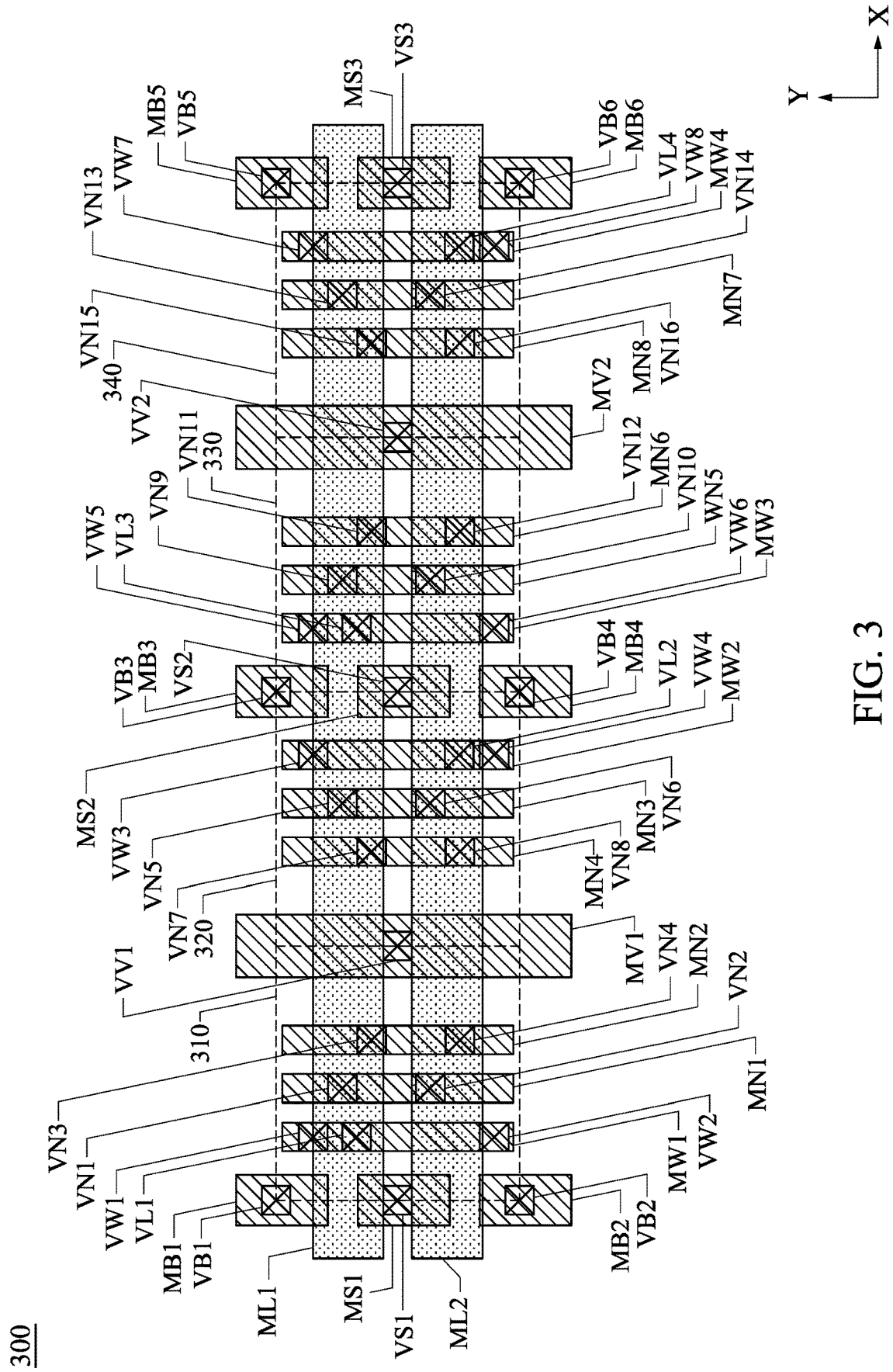
FIG. 3 is a schematic layout of an integrated circuit including structures corresponding to a portion of the memory device shown in FIG. 1, in accordance with some embodiments of the present disclosure.

FIG. 3 is a schematic layout 300 of an integrated circuit including structures corresponding to a portion of the memory device 100 shown in FIG. 1, in accordance with some embodiments of the present disclosure. For simplicity of illustration, the schematic layout 300 only shows a portion of structures, and the other portion of structures as can be known by one of ordinary skill in the art is not detailed in FIG. 3.

As illustratively shown in FIG. 3, the schematic layout 300 includes memory cells 310 and 320 arranged in the X direction in order. In some embodiments, the memory cell 320 is abutted with the memory cell 310. For illustration of FIG. 3 with reference to FIG. 1, the memory cells 310 and 320 correspond to the memory cells 110 and 120, respectively.

For illustration of FIG. 3 with reference to FIG. 2A, each of the memory cells 310 and 320 has configuration similar with the memory cell 210. For example, each of the memory cells 310 and 320 includes two active areas (not shown in FIG. 3) corresponding to the active areas AA1 and AA2, and has four gate structures (not shown in FIG. 3) corresponding to the gate structures GS1-GS4, for forming corresponding ones of the switches T11-T14, P11-P14 and S11-S14 shown in FIG. 1.

As illustratively shown in FIG. 3, the schematic layout 300 further includes conductive segments MB1-MB4, MS1-MS2, MW1-MW2, MN1-MN4, MV1 and conductive lines ML1, ML2. In some embodiments, the conductive segments MB1-MB4, MS1-MS2, MW1-MW2, MN1-MN4, MV1 extend in the Y direction and the conductive lines ML1 and ML2 extend in the X direction. As illustratively shown in FIG. 3, the conductive lines ML1 and ML2 are crossing over the conductive segments MW1-MW2, MN1-MN4 and MV1. For illustration of FIG. 3 with reference to FIG. 1, in some embodiments, the word lines WL11 and WL12 are implemented by the conductive lines ML1 and ML2, respectively.

As illustratively shown in FIG. 3, the conductive segments MW1, MN1 and MN2 are crossing over the memory cell 310. The conductive segments MS1, MB1 and MB2 are disposed at a boundary of the memory cell 310, the conductive segment MV1 is disposed at a boundary between the memory cells 310 and 320. The conductive segments MW2, MN3 and MN4 are crossing over the memory cell 320. The conductive segments MS2, MB3 and MB4 are disposed at a boundary of the memory cell 320.

As illustratively shown in FIG. 3, the conductive segment MW1 is coupled to the memory cell 310 through the vias VW1 and VW2, the conductive segment MN1 is coupled to the memory cell 310 through the vias VN1 and VN2, and the conductive segment MN2 is coupled to the memory cell 310 through the vias VN3 and VN4. The conductive segments MV1, MS1, MB1 and MB2 are coupled to the memory cell 310 through the vias VV1, VS1, VB1 and VB2, respectively. The conductive segment MW1 is coupled to the conductive line ML1 through the via VL1.

As illustratively shown in FIG. 3, the conductive segment MW2 is coupled to the memory cell 320 through the vias VW3 and VW4, the conductive segment MN3 is coupled to the memory cell 320 through the vias VN5 and VN6, and the conductive segment MN4 is coupled to the memory cell 320 through the vias VN7 and VN8. The conductive segments MV1, MS2, MB3 and MB4 are coupled to the memory cell 320 through the vias VV1, VS2, VB3 and VB4, respectively. The conductive segment MW2 is coupled to the conductive line ML2 through the via VL2.

For illustration of FIG. 3 with reference to FIG. 1, the memory cell 110 is implemented as the memory cell 310 in some embodiments. In such embodiments, the conductive line ML1 is configured to receive the word line signal WS11. The via VL1 is configured to receive the word line signal WS11 through the conductive line ML1 and transmit the word line signal WS11 to the memory cell 310 through the conductive segment MW1 and the vias VW1 and VW2. The conductive segments MV1 and MS1 are configured to receive the reference voltage signals VDD and VSS, respectively. The conductive segments MV1 and MS1 are configured to provide the reference voltage signals VDD and VSS to the memory cell 310. The conductive segments MN1 and MN2 correspond to the nodes N13 and N14, respectively.

For illustration of FIG. 3 with reference to FIG. 2A and FIG. 2B, the memory cell 310 corresponds to the memory cell 210 in some embodiments. Accordingly, the conductive segments M01-M07 correspond to the conductive segments MB1, MS1, MB2, MW1, MN1, MN2 and MV1, respectively. The vias VD1-VD10 correspond to VB1, VS1, VB2, VN1, VN4, VS1, VV1, VN3, VN2, VW1 and VW2, respectively. The gate structures GS1 and GS4 are coupled to the conductive line ML1 through the conductive segment MW1 and the vias VW1 and VW2.

For illustration of FIG. 3 with reference to FIG. 1, the memory cell 120 is implemented as the memory cell 320 in some embodiments. In such embodiments, the conductive line ML2 is configured to receive the word line signal WS12. The via VL2 is configured to receive the word line signal WS12 through the conductive line ML2 and transmit the word line signal WS12 to the memory cell 320 through the conductive segment MW2 and the vias VW3 and VW4. The conductive segments MV1 and MS2 are configured to receive the reference voltage signals VDD and VSS, respectively. The conductive segments MV1 and MS2 are configured to provide the reference voltage signals VDD and VSS to the memory cell 320. The conductive segments MN3 and MN4 correspond to the nodes N15 and N16, respectively.

For illustration of FIG. 3 with reference to FIG. 2A and FIG. 2B, the memory cell 320 corresponds to the memory cell 210 in some embodiments. Accordingly, the conductive segments M01-M07 correspond to the conductive segments MB3, MS2, MB4, MW2, MN3, MN4 and MV1, respectively. The vias VD1-VD10 correspond to VB3, VS2, VB4, VN5, VN8, VS2, VV1, VN7, VN6, VW3 and VW4, respectively. The gate structures GS1 and GS2 are coupled to the conductive line ML2 through the conductive segment MW2 and the vias VW3 and VW4.

In some embodiments, the memory cells 110 and 120 correspond to the memory cells 310 and 320, respectively. In such embodiments, the conductive segment MV1 is configured to provide the reference voltage signal VDD to the memory cells 310 and 320. In other words, the memory cells 310 and 320 share the conductive segment MV1.

As illustratively shown in FIG. 3, the schematic layout 300 further includes memory cells 330 and 340 arranged in the X direction in order. In some embodiments, the memory cell 330 is abutted with and disposed between the memory cells 320 and 340. For illustration of FIG. 3 with reference to FIG. 1, the memory cells 330 and 340 correspond to the memory cells 130 and 140, respectively.

For illustration of FIG. 3 with reference to FIG. 2A, each of the memory cells 330 and 340 has configuration similar with the memory cell 210. For example, each of the memory cells 330 and 340 includes two active areas (not shown in FIG. 3) corresponding to the active areas AA1 and AA2, and has four gate structures (not shown in FIG. 3) corresponding to the gate structures GS1-GS4, for forming corresponding ones of the switches T15-T18, P15-P18 and S15-S18 shown in FIG. 1.

As illustratively shown in FIG. 3, the schematic layout 300 further includes conductive segments MB5-MB6, MS3, MW3-MW4, MN5-MN8 and MV2. In some embodiments, the conductive segments MB5-MB6, MS3, MW3-MW4, MN5-MN8 and MV2 extend in the Y direction. As illustratively shown in FIG. 3, the conductive lines ML1 and ML2 are further crossing over the conductive segments MW3-MW4, MN5-MN8 and MV2.

As illustratively shown in FIG. 3, the conductive segments MS2, MB3 and MB4 are disposed at a boundary between the memory cells 320 and 330. The conductive segments MW3, MN5 and MN6 are crossing over the memory cell 330. The conductive segment MV2 is disposed at a boundary between the memory cells 330 and 340. The conductive segments MS3, MB5 and MB6 are disposed at a boundary of the memory cell 340.

As illustratively shown in FIG. 3, the conductive segment MW3 is coupled to the memory cell 330 through the vias VW5 and VW6, the conductive segment MN5 is coupled to the memory cell 330 through the vias VN9 and VN10, and the conductive segment MN6 is coupled to the memory cell 330 through the vias VN11 and VN12. The conductive segments MV2, MS2, MB3 and MB4 are coupled to the memory cell 330 through the vias VV2, VS2, VB3 and VB4, respectively. The conductive segment MW3 is coupled to the conductive line ML1 through the via VL3.

As illustratively shown in FIG. 3, the conductive segment MW4 is coupled to the memory cell 340 through the vias VW7 and VW8, the conductive segment MN7 is coupled to the memory cell 340 through the vias VN13 and VN14, and the conductive segment MN8 is coupled to the memory cell 340 through the vias VN15 and VN16. The conductive segments MV2, MS3, MB5 and MB6 are coupled to the memory cell 340 through the vias VV2, VS3, VB5 and VB6, respectively. The conductive segment MW3 is coupled to the conductive line ML2 through the via VL4.

For illustration of FIG. 3 with reference to FIG. 1, the memory cell 130 is implemented as the memory cell 330 in some embodiments. In such embodiments, the conductive line ML1 is configured to receive the word line signal WS11. The via VL3 is configured to receive the word line signal WS11 through the conductive line ML1 and transmit the word line signal WS11 to the memory cell 330 through the conductive segment MW3 and the vias VW5 and VW6. The conductive segments MV2 and MS2 are configured to receive the reference voltage signals VDD and VSS, respectively. The conductive segments MV2 and MS2 are configured to provide the reference voltage signals VDD and VSS to the memory cell 330. The conductive segments MN5 and MN6 correspond to the nodes N17 and N18, respectively.

For illustration of FIG. 3 with reference to FIG. 2A and FIG. 2B, the memory cell 330 corresponds to the memory cell 210 in some embodiments. Accordingly, the conductive segments M01-M07 correspond to the conductive segments MB3, MS2, MB4, MW3, MN5, MN6 and MV2, respectively. The vias VD1-VD10 correspond to VB3, VS2, VB4, VN9, VN12, VS2, VV2, VN11, VN10, VW5 and VW6, respectively. The gate structures GS1 and GS2 are coupled to the conductive line ML1 through the conductive segment MW3 and the vias VW5 and VW6.

For illustration of FIG. 3 with reference to FIG. 1, the memory cell 140 is implemented as the memory cell 340 in some embodiments. In such embodiments, the conductive line ML2 is configured to receive the word line signal WS12. The via VL4 is configured to receive the word line signal WS12 through the conductive line ML2 and transmit the word line signal WS12 to the memory cell 340 through the conductive segment MW4 and the vias VW7 and VW8. The conductive segments MV2 and MS3 are configured to receive the reference voltage signals VDD and VSS, respectively. The conductive segments MV2 and MS3 are configured to provide the reference voltage signals VDD and VSS to the memory cell 340. The conductive segments MN7 and MN8 correspond to the nodes N19 and N110, respectively.

For illustration of FIG. 3 with reference to FIG. 2A and FIG. 2B, the memory cell 340 corresponds to the memory cell 210 in some embodiments. Accordingly, the conductive segments M01-M07 correspond to the conductive segments MB5, MS3, MB6, MW4, MN7, MN8 and MV2, respectively. The vias VD1-VD10 correspond to VB5, VS3, VB6, VN13, VN16, VS3, VV2, VN15, VN14, VW7 and VW8, respectively. The gate structures GS1 and GS2 are coupled to the conductive line ML2 through the conductive segment MW4 and the vias VW7 and VW8.

In some embodiments, the memory cells 110, 120, 130 and 140 correspond to the memory cells 310, 320, 330 and 340, respectively. In such embodiments, the conductive segment MV1 is configured to provide the reference voltage signal VDD to the memory cells 310 and 320, the conductive segment MV2 is configured to provide the reference voltage signal VDD to the memory cells 330 and 340, and the conductive segment MS2 is configured to provide the reference voltage signal VSS to the memory cells 330 and 340. In other words, the memory cells 310 and 320 share the conductive segment MV1, the memory cells 330 and 340 share the conductive segment MV2, and the memory cells 320 and 330 share the conductive segment MS2.

Figure 4A:
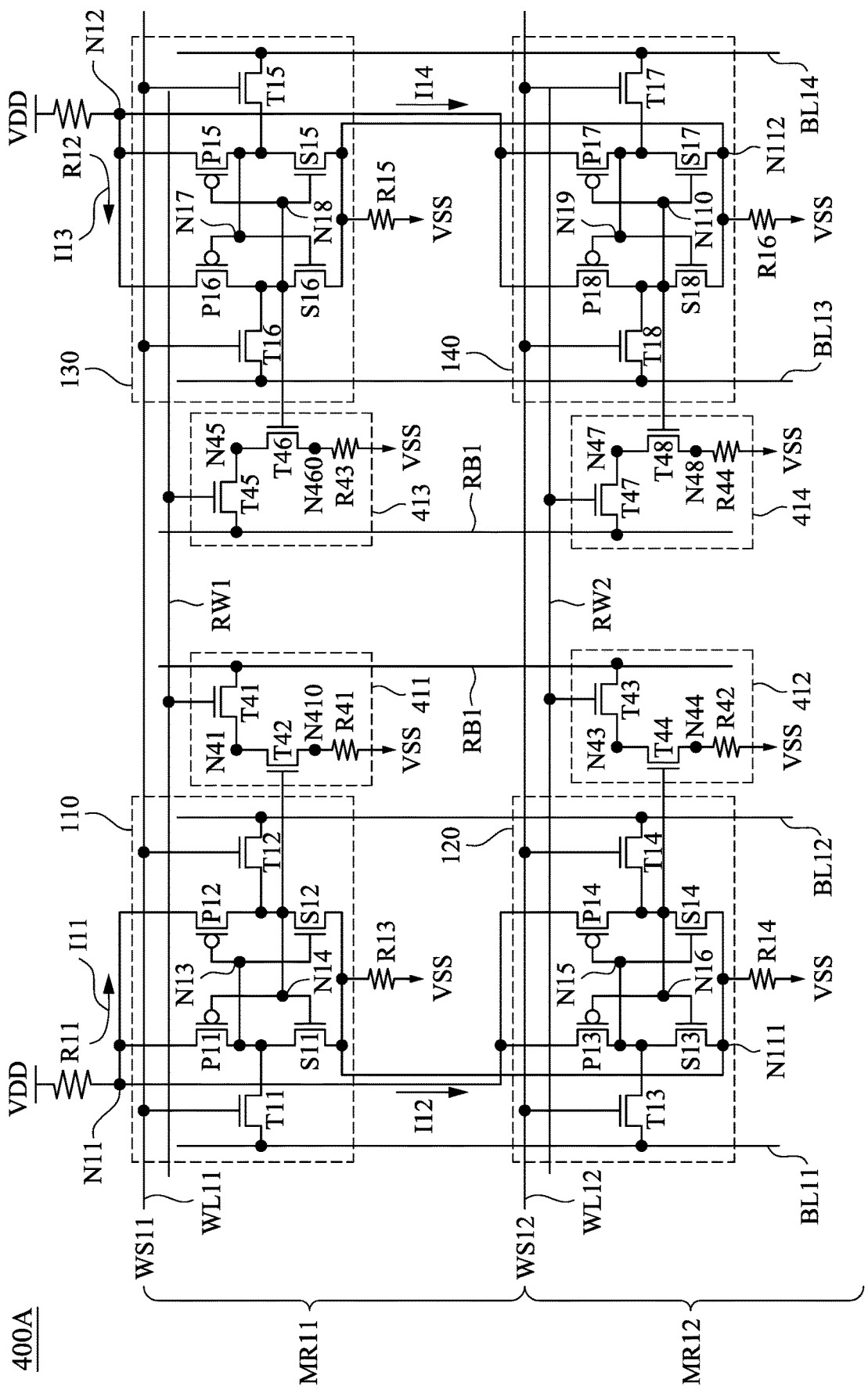
FIG. 4A is a circuit diagram of a memory device in accordance with some embodiments of the present disclosure.

FIG. 4A is a circuit diagram of a memory device 400A in accordance with some embodiments of the present disclosure. For illustration of FIG. 4A with reference to FIG. 1, the memory device 400A is similar to the memory device 100. FIG. 4A follows a similar labeling convention to that of FIG. 1. For brevity, the discussion will focus more on differences between FIG. 1 and FIG. 4A than on similarities.

As illustratively shown in FIG. 4A, the memory device 400A includes a reading circuit 410. In some embodiments, the reading circuit 410 is configured to read data stored in the memory cells 110, 120, 130 and 140. In some embodiments, the reading circuit 410 includes reading units 411-414.

In some embodiments, the reading unit 411 is configured to generate a data signal and transmit the data signal to a bit line RB1 based on the data stored in the memory cell 110, the reading unit 412 is configured to generate a data signal and transmit the data signal to the bit line RB1 based on the data stored in the memory cell 120, the reading unit 413 is configured to generate a data signal and transmit the data signal to a bit line RB2 based on the data stored in the memory cell 130, and the reading unit 414 is configured to generate a data signal and transmit the data signal to a bit line RB2 based on the data stored in the memory cell 140.

In some embodiments, the reading unit 411 includes switches T41, T42 and a resistor R41. As illustratively shown in FIG. 4A, a control terminal of the switch T41 is coupled to a word line RW1, a terminal of the switch T41 is coupled to the bit line RB1, another terminal of the switch T41 is coupled to a node N41. A control terminal of the switch T42 is coupled to the node N14, a terminal of the switch T42 is coupled to the node N41, another terminal of the switch T42 is coupled to a node N42. A terminal of the resistor R41 is coupled to the node N42, another terminal of the resistor R41 is configured to receive the reference voltage signal VSS.

In some embodiments, the reading unit 412 includes switches T43, T44 and a resistor R42. As illustratively shown in FIG. 4A, a control terminal of the switch T43 is coupled to a word line RW2, a terminal of the switch T43 is coupled to the bit line RB1, another terminal of the switch T41 is coupled to a node N43. A control terminal of the switch T44 is coupled to the node N16, a terminal of the switch T44 is coupled to the node N43, another terminal of the switch T44 is coupled to a node N44. A terminal of the resistor R42 is coupled to the node N44, another terminal of the resistor R42 is configured to receive the reference voltage signal VSS.

In some embodiments, the reading unit 413 includes switches T45, T46 and a resistor R43. As illustratively shown in FIG. 4A, a control terminal of the switch T45 is coupled to a word line RW1, a terminal of the switch T45 is coupled to the bit line RB2, another terminal of the switch T45 is coupled to a node N45. A control terminal of the switch T46 is coupled to the node N18, a terminal of the switch T46 is coupled to the node N45, another terminal of the switch T46 is coupled to a node N46. A terminal of the resistor R43 is coupled to the node N46, another terminal of the resistor R43 is configured to receive the reference voltage signal VSS.

In some embodiments, the reading unit 414 includes switches T47, T48 and a resistor R44. As illustratively shown in FIG. 4A, a control terminal of the switch T47 is coupled to the word line RW2, a terminal of the switch T47 is coupled to the bit line RB2, another terminal of the switch T47 is coupled to a node N47. A control terminal of the switch T48 is coupled to the node N110, a terminal of the switch T48 is coupled to the node N47, another terminal of the switch T48 is coupled to a node N48. A terminal of the resistor R44 is coupled to the node N48, another terminal of the resistor R44 is configured to receive the reference voltage signal VSS.

In some embodiments, the switches T41-T48 are implemented as NMOS transistors.

Figure 4B:
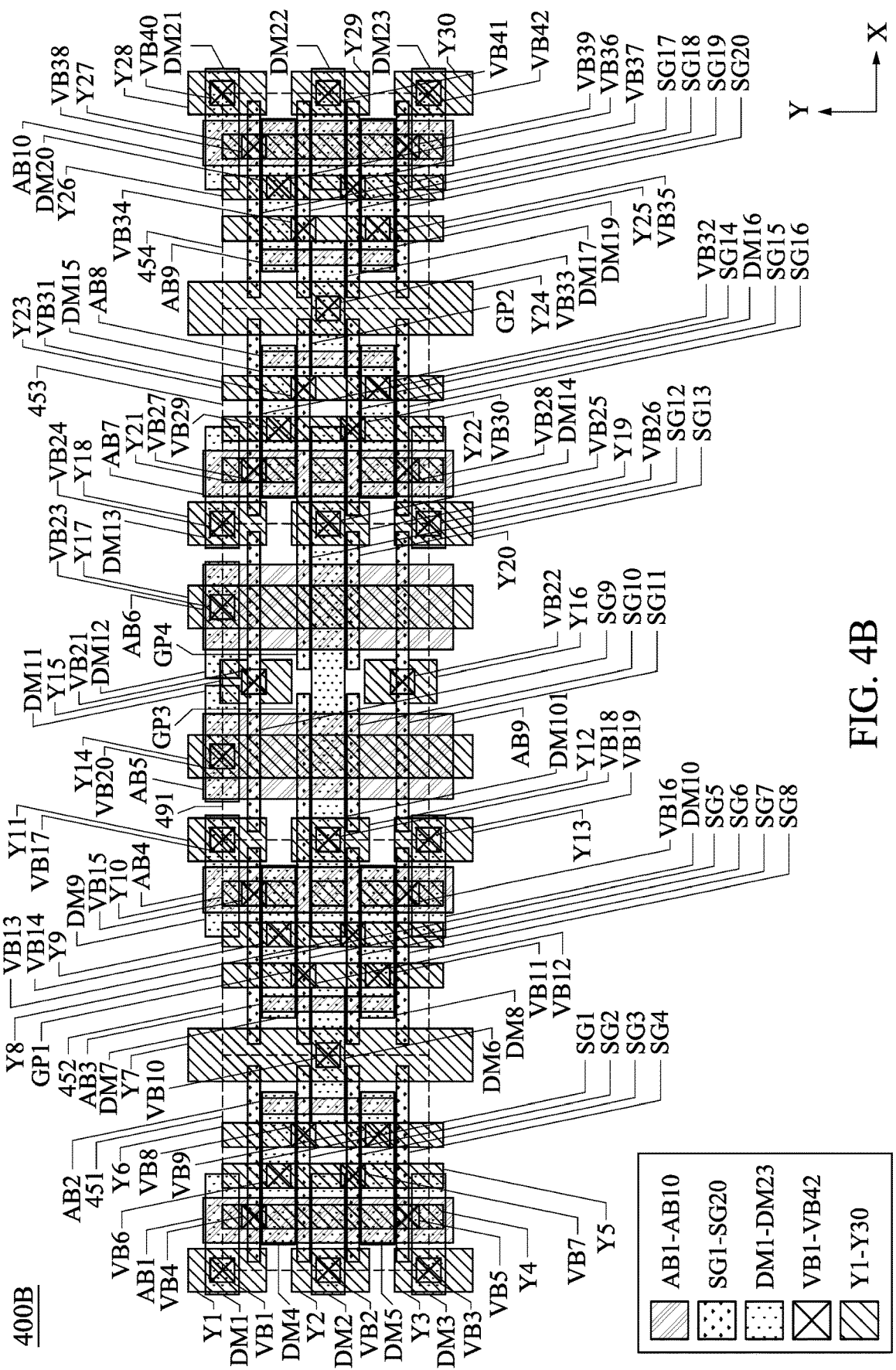
FIG. 4B is a schematic layout of an integrated circuit including structures corresponding to a portion of the memory device shown in FIG. 4A, in accordance with some embodiments of the present disclosure.

FIG. 4B is a schematic layout 400B of an integrated circuit including structures corresponding to a portion of the memory device 400A shown in FIG. 4A, in accordance with some embodiments of the present disclosure. For simplicity of illustration, the schematic layout 400B only shows a portion of structures, and the other portion of structures as can be known by one of ordinary skill in the art is not detailed in FIG. 4B.

As illustratively shown in FIG. 4B, the schematic layout 400B includes memory cells 451 and 452 arranged in the X direction in order. For illustration of FIG. 4B with reference to FIG. 4A, the memory cells 451 and 452 correspond to the memory cells 110 and 120, respectively.

As illustratively shown in FIG. 4B, the memory cell 451 includes active areas AB1, AB2 and gate structures SG1-SG4. The memory cell 452 includes active areas AB3, AB4, gate structures SG5, SG7, SG8 and a gate portion GP1 of a gate structure SG6. In some embodiments, the active areas AB1-AB4 extend in the Y direction, and the gate structures SG1-SG8 extend in the X direction.

As illustratively shown in FIG. 4B, the schematic layout 400B further includes conductive segments DM1-DM10, DM101 and Y1-Y13. In some embodiments, the conductive segments Y1-Y13 extend in the Y direction, and the conductive segments DM1-DM10, DM101 extend in the X direction.

As illustratively shown in FIG. 4B, the gate structures SG2, SG3 and the conductive segments DM4, DM5 are crossing over the active areas AB1 and AB2. The gate structures SG1, SG4 and the conductive segments DM1-DM3 are crossing over the active area AB1. The conductive segment DM6 is crossing over the active areas AB2 and AB3. The conductive segments DM9, DM10, DM101 and the gate structures SG5, SG8 are crossing over the active area AB4. The conductive segments DM7, DM8, the gate structure SG7 and the gate portion GP1 are crossing over the active areas AB3 and AB4.

As illustratively shown in FIG. 4B, the conductive segments Y1-Y3 are disposed at a boundary of the memory cell 451. The conductive segments Y1-Y3 are crossing over the conductive segments DM1-DM3, respectively. The conductive segment Y4 is crossing over the conductive segments DM1-DM5 and the gate structures SG1-SG4. Each of the conductive segments Y5 and Y6 is crossing over the conductive segments DM4-DM5 and the gate structures SG1-SG4. The conductive segment Y7 is crossing over the conductive segment DM6, and is disposed at a boundary between the memory cells 451 and 452. The conductive segments Y11-Y13 are disposed at a boundary of the memory cell 452. The conductive segments Y11-Y13 are crossing over the conductive segments DM9, DM101 and DM10, respectively. The conductive segment Y10 is crossing over the conductive segments DM7-DM10, DM101 and the gate structures SG5-SG8. Each of the conductive segments Y8 and Y9 is crossing over the conductive segments DM7-DM8 and the gate structures SG5-SG8.

As illustratively shown in FIG. 4B, the active areas AB1 and AB2 are coupled to the conductive segment Y5 through the conductive segment DM4 and a via VB6, and are coupled to the conductive segment Y6 through the conductive segment DM5 and a via VB9. The gate structures SG1 and SG4 are coupled to the conductive segment Y4 through a vias VB4 and VB5. The gate structure SG3 is coupled to the conductive segment Y5 through a via VB7. The gate structure SG2 is coupled to the conductive segment Y6 through a via VB8. The active area AB1 is coupled to the conductive segment Y1 through the conductive segment DM1 and a via VB1, coupled to the conductive segment Y2 through the conductive segment DM2 and a via VB2, and coupled to the conductive segment Y3 through the conductive segment DM3 and a via VB3. The active area AB2 is coupled to the conductive segment Y7 through the conductive segment DM6 and a via VB10.

As illustratively shown in FIG. 4B, the active areas AB1 and AB2 are coupled to the conductive segment Y5 through the conductive segment DM4 and a via VB6, and are coupled to the conductive segment Y6 through the conductive segment DM5 and a via VB9. The gate structures SG1 and SG4 are coupled to the conductive segment Y4 through vias VB4 and VB5, respectively. The gate structure SG3 is coupled to the conductive segment Y5 through a via VB7. The gate structure SG2 is coupled to the conductive segment Y6 through a via VB8. The active area AB1 is coupled to the conductive segment Y1 through the conductive segment DM1 and a via VB1, is coupled to the conductive segment Y2 through the conductive segment DM2 and a via VB2, and is coupled to the conductive segment Y3 through the conductive segment DM3 and a via VB3. The active area AB2 is coupled to the conductive segment Y7 through the conductive segment DM6 and a via VB10.

As illustratively shown in FIG. 4B, the active areas AB3 and AB4 are coupled to the conductive segment Y8 through the conductive segment DM8 and a via VB11, and are coupled to the conductive segment Y9 through the conductive segment DM7 and a via VB14. The gate structures SG5 and SG8 are coupled to the conductive segment Y10 through a vias VB15 and VB16. The gate portion GP1 of the gate structure SG6 is coupled to the conductive segment Y8 through a via VB12. The gate structure SG7 is coupled to the conductive segment Y9 through a via VB13. The active area AB4 is coupled to the conductive segment Y11 through the conductive segment DM9 and a via VB17, is coupled to the conductive segment Y12 through the conductive segment DM101 and a via VB18, and is coupled to the conductive segment Y13 through the conductive segment DM10 and a via VB19. The active area AB3 is coupled to the conductive segment Y7 through the conductive segment DM6 and a via VB10.

In some embodiments, a control terminal of a switch, such as one of the switches T11-T18, S11-S18 and P11-P18 shown in FIG. 4A, is referred to as a gate terminal, and two terminals of the switch is referred to as source/drain terminals. For illustration of FIG. 4B with reference to FIG. 4A, in some embodiments, the memory cell 110 is implemented as the memory cell 451. In such embodiments, a gate terminal of the switch T11 corresponds to the gate structure SG1, a gate terminal of the switch T12 corresponds to the gate structure SG4, gate terminals of the switches P11 and S11 correspond to the gate structure SG2, and gate terminals of the switches P12 and S12 correspond to the gate structure SG3. The source/drain terminals of the switches T11, T12, S11 and S12 correspond to the active area AB1. The source/drain terminals of the switches P11 and P12 correspond to the active area AB2. The nodes N13 and N14 correspond to the conductive segments Y6 and Y5, respectively. The conductive segment Y4 is configured to receive the word line signal WS11 from the word line WL11. The conductive segments Y2 and Y7 are configured to receive the reference voltage signals VSS and VDD, respectively. In some embodiments, the resistor R11 is referred to as an equivalent resistor of at least the conductive segment Y7, DM6 and the via VB10, and the resistor R13 is referred to as an equivalent resistor of at least the conductive segment Y2, DM2 and the via VB2.

For illustration of FIG. 4B with reference to FIG. 4A, in some embodiments, the memory cell 120 is implemented as the memory cell 452. In such embodiments, a gate terminal of the switch T13 corresponds to the gate structure SG5, a gate terminal of the switch T14 corresponds to the gate structure SG8, gate terminals of the switches P13 and S13 correspond to the gate portion GP1, and gate terminals of the switches P14 and S14 correspond to the gate structure SG7. The source/drain terminals of the switches T13, T14, S13 and S14 correspond to the active area AB4. The source/drain terminals of the switches P13 and P14 correspond to the active area AB3. The nodes N15 and N16 correspond to the conductive segments Y8 and Y9, respectively. The conductive segment Y10 is configured to receive the word line signal WS12 from the word line WL12. The conductive segments Y12 and Y7 are configured to receive the reference voltage signals VSS and VDD, respectively. In some embodiments, the resistor R14 is referred to as an equivalent resistor of at least the conductive segment Y12, DM101 and the via VB18.

For illustration of FIG. 4B with reference to FIG. 4A, in some embodiments, the memory cells 110 and 120 are implemented as the memory cells 451 and 452, respectively. In such embodiments, the memory cells 451 and 452 receive the voltage signal VDD through the conductive segments Y7, DM6 and the via VB10. In other words, the memory cells 451 and 452 share the conductive segments Y7, DM6 and the via VB10.

For illustration of FIG. 4B with reference to FIG. 3, in some embodiments, the memory cells 310 and 320 are implemented as the memory cells 451 and 452, respectively. In such embodiments, the conductive segments MW1 and MW2 are implemented as the conductive segments Y4 and Y10, respectively. The conductive segment Y4 is coupled to the conductive line ML1 through the via VL1, and the conductive segment Y10 is coupled to the conductive line ML2 through the via VL2.

As illustratively shown in FIG. 4B, the schematic layout 400B further includes memory cells 453 and 454 arranged in the X direction in order. The memory cell 453 is arranged between the memory cells 452 and 454. For illustration of FIG. 4B with reference to FIG. 4A, the memory cells 453 and 454 correspond to the memory cells 130 and 140.

As illustratively shown in FIG. 4B, the memory cell 454 includes active areas AB9, AB10 and gate structures SG17-SG20. The memory cell 453 includes active areas AB7, AB8, gate structures SG14-SG16 and a gate portion GP2 of a gate structure SG12. In some embodiments, the active areas AB7-AB10 extend in the Y direction, and the gate structures SG14-SG20 and SG12 extend in the X direction.

As illustratively shown in FIG. 4B, the schematic layout 400B further includes conductive segments DM13-DM17, DM19-DM23 and Y18-Y30. In some embodiments, the conductive segments Y18-Y30 extend in the Y direction, and the conductive segments DM13-DM17, DM19-DM23 extend in the X direction.

As illustratively shown in FIG. 4B, the gate structures SG18, SG19 and the conductive segments DM19, DM20 are crossing over the active areas AB9 and AB10. The gate structures SG17, SG20 and the conductive segments DM21-DM23 are crossing over the active area AB10. The conductive segment DM17 is crossing over the active areas AB8 and AB9. The conductive segments DM13, DM14, DM101 and the gate structures SG14, SG16 are crossing over the active area AB7. The conductive segments DM15, DM16, the gate structure SG15 and the gate portion GP2 are crossing over the active areas AB7 and AB8.

As illustratively shown in FIG. 4B, the conductive segments Y28-Y30 are disposed at a boundary of the memory cell 454. The conductive segments Y28-Y30 are crossing over the conductive segments DM21-DM23, respectively. The conductive segment Y27 is crossing over the conductive segments DM19-DM23 and the gate structures SG17-SG20. Each of the conductive segments Y25 and Y26 is crossing over the conductive segments DM19-DM20 and the gate structures SG17-SG20. The conductive segment Y24 is crossing over the conductive segment DM17, and is disposed at a boundary between the memory cells 453 and 454. The conductive segments Y18-Y20 are disposed at a boundary of the memory cell 453. The conductive segments Y18-Y20 are crossing over the conductive segments DM13, DM101 and DM14, respectively. The conductive segment Y21 is crossing over the conductive segments DM13-DM16, DM101 and the gate structures SG14-SG16 and SG12. Each of the conductive segments Y22 and Y23 is crossing over the conductive segments DM15-DM16 and the gate structures SG14-SG16 and SG12.

As illustratively shown in FIG. 4B, the active areas AB9 and AB10 are coupled to the conductive segment Y25 through the conductive segment DM19 and a via VB35, and are coupled to the conductive segment Y26 through the conductive segment DM20 and a via VB36. The gate structures SG17 and SG20 are coupled to the conductive segment Y27 through vias VB38 and VB39, respectively. The gate structure SG19 is coupled to the conductive segment Y26 through a via VB37. The gate structure SG18 is coupled to the conductive segment Y25 through a via VB34. The active area AB10 is coupled to the conductive segment Y28 through the conductive segment DM21 and a via VB40, is coupled to the conductive segment Y29 through the conductive segment DM22 and a via VB41, and is coupled to the conductive segment Y30 through the conductive segment DM23 and a via VB42. The active area AB9 is coupled to the conductive segment Y24 through the conductive segment DM17 and a via VB33.

As illustratively shown in FIG. 4B, the active areas AB7 and AB8 are coupled to the conductive segment Y23 through the conductive segment DM16 and a via VB32, and are coupled to the conductive segment Y22 through the conductive segment DM15 and a via VB29. The gate structures SG14 and SG16 are coupled to the conductive segment Y21 through vias VB27 and VB28. The gate portion GP2 of the gate structure SG12 is coupled to the conductive segment Y23 through a via VB31. The gate structure SG15 is coupled to the conductive segment Y22 through a via VB30. The active area AB7 is coupled to the conductive segment Y18 through the conductive segment DM13 and a via VB24, is coupled to the conductive segment Y19 through the conductive segment DM101 and a via VB25, and is coupled to the conductive segment Y20 through the conductive segment DM14 and a via VB26. The active area AB8 is coupled to the conductive segment Y24 through the conductive segment DM17 and the via VB33.

For illustration of FIG. 4B with reference to FIG. 4A, in some embodiments, the memory cell 130 is implemented as the memory cell 453. In such embodiments, a gate terminal of the switch T15 corresponds to the gate structure SG14, a gate terminal of the switch T16 corresponds to the gate structure SG16, gate terminals of the switches P15 and S15 correspond to the gate structure SG12, and gate terminals of the switches P16 and S16 correspond to the gate structure SG15. The source/drain terminals of the switches T15, T16, S15 and S16 correspond to the active area AB7. The source/drain terminals of the switches P15 and P16 correspond to the active area AB8. The nodes N17 and N18 correspond to the conductive segments Y23 and Y22, respectively. The conductive segment Y21 is configured to receive the word line signal WS11 from the word line WL11. The conductive segments Y19 and Y24 are configured to receive the reference voltage signals VSS and VDD, respectively. In some embodiments, the resistor R12 is referred to as an equivalent resistor of at least the conductive segment Y24, DM17 and the via VB33, and the resistor R15 is referred to as an equivalent resistor of at least the conductive segment Y19, DM101 and the via VB25.

For illustration of FIG. 4B with reference to FIG. 4A, in other embodiments, the memory cell 140 is implemented as the memory cell 453. In such embodiments, a gate terminal of the switch T17 corresponds to the gate structure SG14, a gate terminal of the switch T18 corresponds to the gate structure SG16, gate terminals of the switches P17 and S17 correspond to the gate structure SG12, and gate terminals of the switches P18 and S18 correspond to the gate structure SG15. The source/drain terminals of the switches T17, T18, S17 and S18 correspond to the active area AB7. The source/drain terminals of the switches P17 and P18 correspond to the active area AB8. The nodes N19 and N110 correspond to the conductive segments Y23 and Y22, respectively. The conductive segment Y21 is configured to receive the word line signal WS12 from the word line WL12. The conductive segments Y19 and Y24 are configured to receive the reference voltage signals VSS and VDD, respectively. In some embodiments, the resistor R16 is referred to as an equivalent resistor of at least the conductive segment Y19, DM101 and the via VB25.

For illustration of FIG. 4B with reference to FIG. 4A, in some embodiments, the memory cell 140 is implemented as the memory cell 454. In such embodiments, a gate terminal of the switch T17 corresponds to the gate structure SG17, a gate terminal of the switch T18 corresponds to the gate structure SG20, gate terminals of the switches P17 and S17 correspond to the gate structure SG18, and gate terminals of the switches P18 and S18 correspond to the gate structure SG19. The source/drain terminals of the switches T17, T18, S17 and S18 correspond to the active area AB10. The source/drain terminals of the switches P17 and P18 correspond to the active area AB9. The nodes N19 and N110 correspond to the conductive segments Y25 and Y26, respectively. The conductive segment Y27 is configured to receive the word line signal WS12 from the word line WL12. The conductive segments Y29 and Y24 are configured to receive the reference voltage signals VSS and VDD, respectively. In some embodiments, the resistor R16 is referred to as an equivalent resistor of at least the conductive segment Y29, DM22 and a via VB41.

For illustration of FIG. 4B with reference to FIG. 4A, in some embodiments, the memory cell 130 is implemented as the memory cell 454. In such embodiments, a gate terminal of the switch T15 corresponds to the gate structure SG17, a gate terminal of the switch T16 corresponds to the gate structure SG20, gate terminals of the switches P15 and S15 correspond to the gate structure SG18, and gate terminals of the switches P16 and S16 correspond to the gate structure SG19. The source/drain terminals of the switches T15, T16, S15 and S16 correspond to the active area AB10. The source/drain terminals of the switches P15 and P16 correspond to the active area AB9. The nodes N17 and N18 correspond to the conductive segments Y25 and Y26, respectively. The conductive segment Y27 is configured to receive the word line signal WS11 from the word line WL11. The conductive segments Y29 and Y24 are configured to receive the reference voltage signals VSS and VDD, respectively. In some embodiments, the resistor R15 is referred to as an equivalent resistor of at least the conductive segment Y29, DM22 and a via VB41.

For illustration of FIG. 4B with reference to FIG. 4A, in some embodiments, one of the memory cells 130 and 140 is implemented as one of the memory cells 453 and 454, and another one of the memory cells 130 and 140 is implemented as another one of the memory cells 453 and 454. In such embodiments, the memory cells 453 and 454 receive the voltage signal VDD through the conductive segments Y24, DM17 and the via VB33. In other words, the memory cells 453 and 454 share the conductive segments Y24, DM17 and the via VB33.

For illustration of FIG. 4B with reference to FIG. 3, in some embodiments, the memory cells 310, 320, 330 and 340 are implemented as the memory cells 451-454, respectively. In such embodiments, the conductive segments MW1-MW4 are implemented as the conductive segments Y4, Y10, Y21 and Y27, respectively. The conductive segments Y4 and Y21 are coupled to the conductive line ML1 through the vias VL1 and VL3, respectively. The conductive segments Y10 and Y27 are coupled to the conductive line ML2 through the vias VL2 and VL4, respectively.

As illustratively shown in FIG. 4B, the schematic layout 400B further includes a reading circuit 491. The reading circuit 491 is arranged between and abutted with the memory cells 452 and 453. For illustration of FIG. 4B with reference to FIG. 4A, the reading circuit 491 corresponds to the reading circuit 410.

As illustratively shown in FIG. 4B, the reading circuit 491 includes active areas AB5, AB6 and gate structures SG9-SG11, SG13, a gate portion GP3 of the gate structure SG6 and a gate portion GP4 of the gate structure SG12. In some embodiments, the active areas AB5-AB6 extend in the Y direction, and the gate structures SG9-SG11 and SG13 extend in the X direction.

As illustratively shown in FIG. 4B, the schematic layout 400B further includes conductive segments DM11-DM12 and Y14-Y17. In some embodiments, the conductive segments Y14-Y17 extend in the Y direction, and the conductive segments DM11-DM12 extend in the X direction.

As illustratively shown in FIG. 4B, the gate structures SG9, SG11 and the conductive segment DM101 are crossing over the active areas AB5 and AB6. The gate structures SG10, the gate portion GP3 and the conductive segment DM11 are crossing over the active area AB5. The gate structures SG13, the gate portion GP4 and the conductive segment DM12 are crossing over the active area AB6.

As illustratively shown in FIG. 4B, the conductive segments Y11-Y13 are disposed at a boundary between the memory cell 452 and the reading device 491. The conductive segment Y14 is crossing over the conductive segment DM11 and the gate structures SG9-SG11, SG6. The conductive segment Y17 is crossing over the conductive segment DM12 and the gate structures SG9, SG11-SG13. The conductive segments Y15 and Y16 are crossing over the gate structures SG19 and SG11, respectively.

As illustratively shown in FIG. 4B, the active area AB5 is coupled to the conductive segment Y14 through a via VB20 and the conductive segment DM11. The active area AB6 is coupled to the conductive segment Y17 through a via VB23 and the conductive segment DM12. The active areas AB5 and AB6 are coupled to the conductive segments Y12 and Y19 through the conductive segment DM101 and the vias VB18, VB25. The gate structure SG9 is coupled to the conductive segment Y15 through a via VB21. The gate structure SG11 is coupled to the conductive segment Y16 through a via VB22.

As illustratively shown in FIG. 4B, the memory cell 452 and the reading device 491 share the gate structure SG6, the conductive segment Y12 and the via VB18. The memory cell 453 and the reading device 491 share the gate structure SG12, the conductive segment Y19 and the via VB25. The memory cells 452, 453 and the reading device 491 share the conductive segment DM101.

For illustration of FIG. 4B with reference to FIG. 4A, in some embodiments, the reading circuit 410 is implemented as the reading circuit 491. In such embodiments, a gate terminal of the switch T44 corresponds to the gate portion GP3, a gate terminal of the switch T48 corresponds to the gate portion GP4, gate terminals of the switches T43 and T47 correspond to the gate structure SG9, a gate terminal of the switch T42 corresponds to the gate structure SG10, a gate terminal of the switch T46 corresponds to the gate structure SG13, gate terminals of the switches T41 and T45 correspond to the gate structure SG11. Source/drain terminals of the switches T41-T44 correspond to the active area AB5, and source/drain terminals of the switches T45-T48 correspond to the active area AB6. The conductive segment DM101 is configured to transmit the reference voltage signal VSS from the conductive segments Y12 and Y19 to the reading circuit 491. The conductive segments Y14 and Y17 are coupled to the bit lines RB1 and RB2, respectively. The conductive segments Y15 and Y16 are coupled to the word lines WB1 and WB2, respectively.

Figure 5:
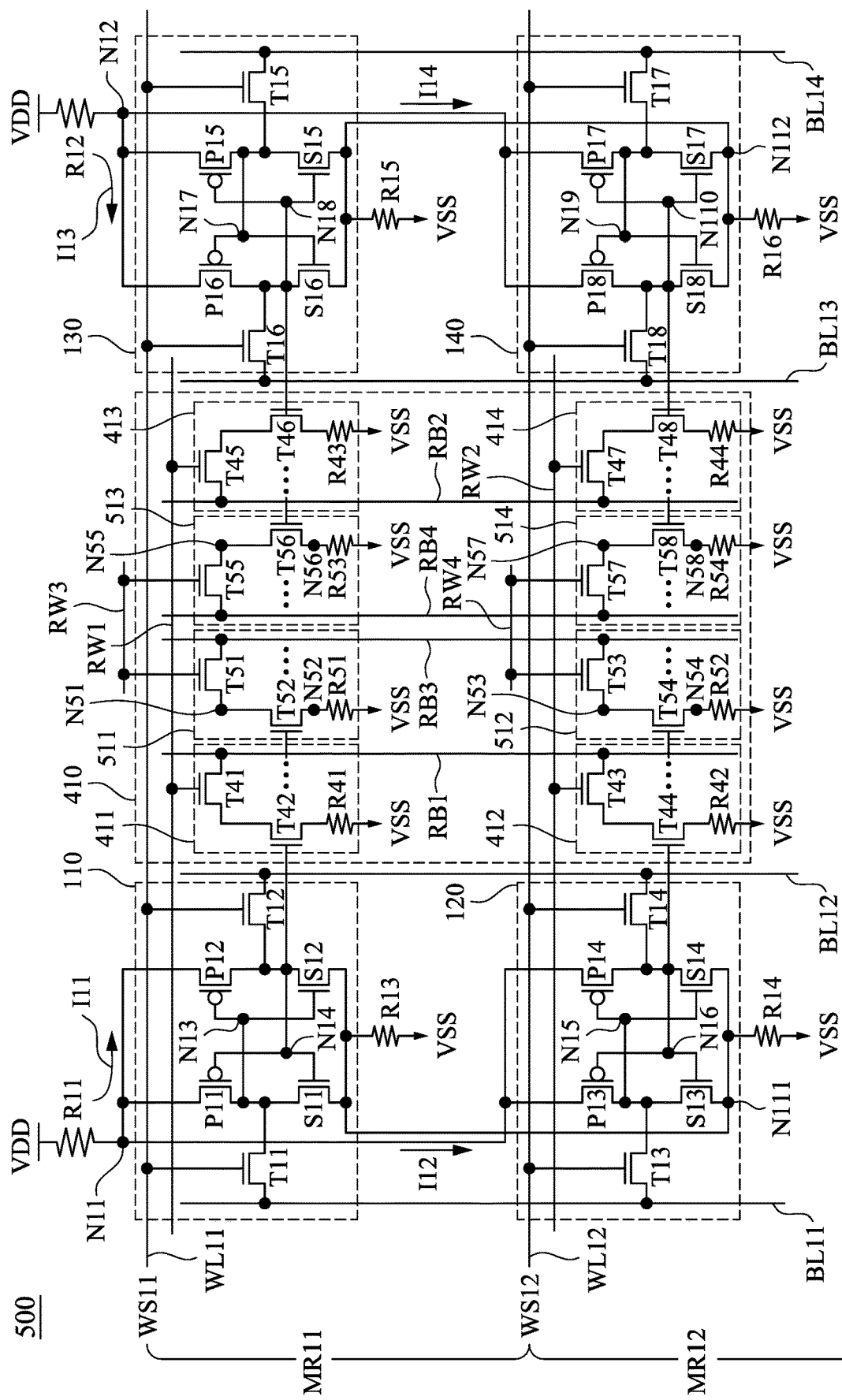
FIG. 5 is a circuit diagram of a memory device in accordance with some embodiments of the present disclosure.

FIG. 5 is a circuit diagram of a memory device 500 in accordance with some embodiments of the present disclosure. For illustration of FIG. 5 with reference to FIG. 4A, the memory device 500 is similar to the memory device 400A. FIG. 5 follows a similar labeling convention to that of FIG. 4A. For brevity, the discussion will focus more on differences between FIG. 4A and FIG. 5 than on similarities.

As illustratively shown in FIG. 5, the reading circuit 410 further includes reading units 511-514. In some embodiments, the reading unit 511 is configured to generate a data signal and transmit the data signal to a bit line RB3 based on the data stored in the memory cell 110, the reading unit 512 is configured to generate a data signal and transmit the data signal to the bit line RB3 based on the data stored in the memory cell 120, the reading unit 513 is configured to generate a data signal and transmit the data signal to a bit line RB4 based on the data stored in the memory cell 130, and the reading unit 514 is configured to generate a data signal and transmit the data signal to a bit line RB4 based on the data stored in the memory cell 140.

In some embodiments, the reading unit 511 includes switches T51, T52 and a resistor R51. As illustratively shown in FIG. 5, a control terminal of the switch T51 is coupled to a word line RW3, a terminal of the switch T51 is coupled to the bit line RB3, another terminal of the switch T51 is coupled to a node N51. A control terminal of the switch T52 is coupled to the node N15, a terminal of the switch T52 is coupled to the node N51, another terminal of the switch T52 is coupled to a node N52. A terminal of the resistor R51 is coupled to the node N52, another terminal of the resistor R51 is configured to receive the reference voltage signal VSS.

In some embodiments, the reading unit 512 includes switches T53, T54 and a resistor R52. As illustratively shown in FIG. 5, a control terminal of the switch T53 is coupled to a word line RW4, a terminal of the switch T53 is coupled to the bit line RB3, another terminal of the switch T51 is coupled to a node N53. A control terminal of the switch T54 is coupled to the node N16, a terminal of the switch T54 is coupled to the node N53, another terminal of the switch T54 is coupled to a node N54. A terminal of the resistor R52 is coupled to the node N54, another terminal of the resistor R52 is configured to receive the reference voltage signal VSS.

In some embodiments, the reading unit 513 includes switches T55, T56 and a resistor R53. As illustratively shown in FIG. 5, a control terminal of the switch T55 is coupled to a word line RW3, a terminal of the switch T55 is coupled to the bit line RB4, another terminal of the switch T55 is coupled to a node N55. A control terminal of the switch T56 is coupled to the node N18, a terminal of the switch T56 is coupled to the node N55, another terminal of the switch T56 is coupled to a node N56. A terminal of the resistor R53 is coupled to the node N56, another terminal of the resistor R53 is configured to receive the reference voltage signal VSS.

In some embodiments, the reading unit 514 includes switches T57, T58 and a resistor R54. As illustratively shown in FIG. 5, a control terminal of the switch T57 is coupled to a word line RW4, a terminal of the switch T57 is coupled to the bit line RB4, another terminal of the switch T57 is coupled to a node N57. A control terminal of the switch T58 is coupled to the node N110, a terminal of the switch T58 is coupled to the node N57, another terminal of the switch T58 is coupled to a node N58. A terminal of the resistor R54 is coupled to the node N58, another terminal of the resistor R54 is configured to receive the reference voltage signal VSS.

In some embodiments, the switches T51-T58 are implemented as NMOS transistors. In various embodiments, the reading circuit 410 further includes various reading units coupled to one of the nodes N14, N16, N18, N110, and configured to generate data signals based on data stored in corresponding one of the memory cells 110, 120, 130 and 140.

Figure 6A:
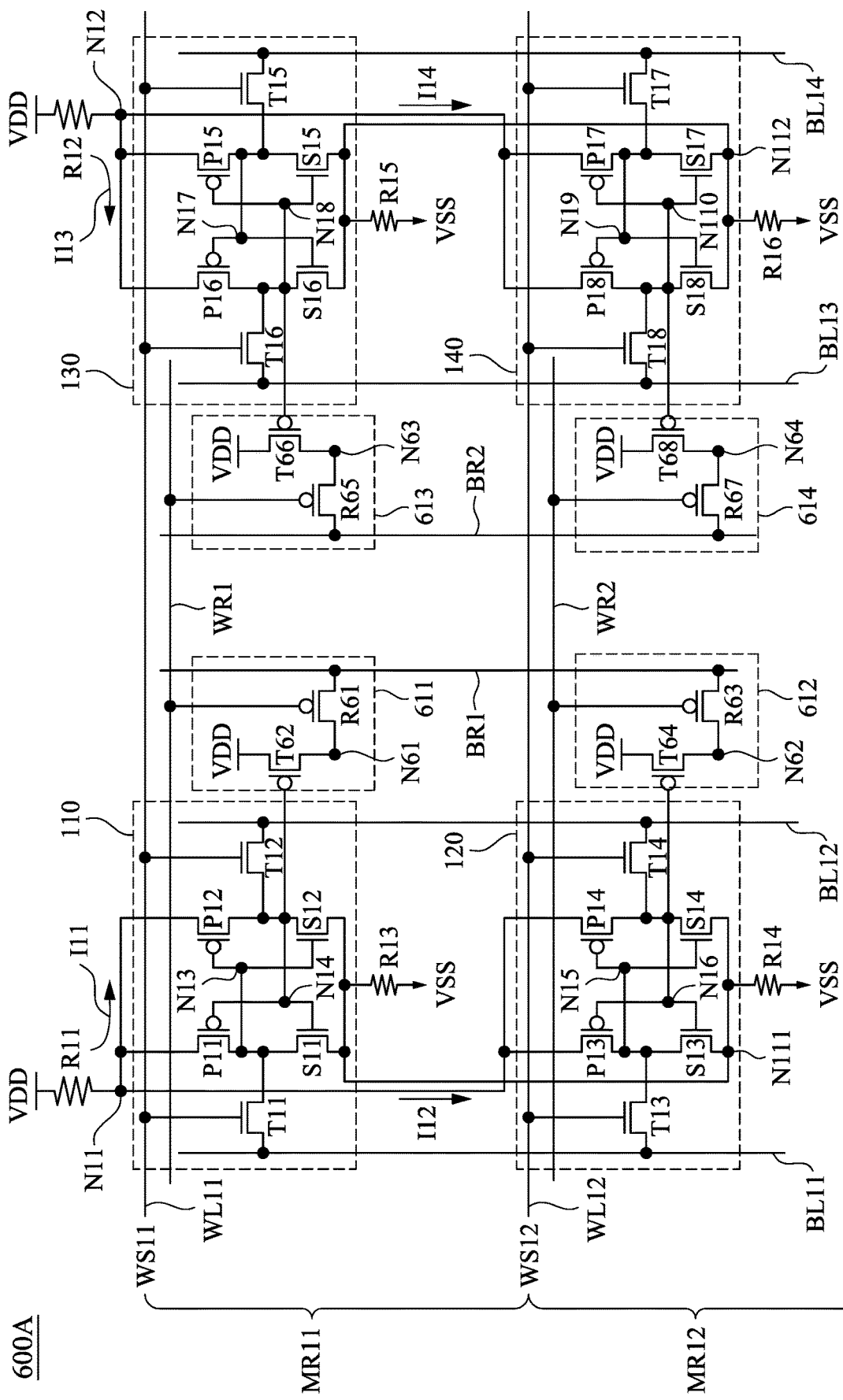
FIG. 6A is a circuit diagram of a memory device in accordance with some embodiments of the present disclosure.

FIG. 6A is a circuit diagram of a memory device 600A in accordance with some embodiments of the present disclosure. For illustration of FIG. 6A with reference to FIG. 1, the memory device 600A is similar to the memory device 100. FIG. 6A follows a similar labeling convention to that of FIG. 1. For brevity, the discussion will focus more on differences between FIG. 1 and FIG. 6A than on similarities.

As illustratively shown in FIG. 6A, the memory device 600A includes a reading circuit 610. In some embodiments, the reading circuit 610 is configured to read data stored in the memory cells 110, 120, 130 and 140. In some embodiments, the reading circuit 610 includes reading units 611-614. For illustration of FIG. 6A with reference to FIG. 4A, the memory device 600A is an alternative embodiment of the memory device 400A. Operations of the reading units 611-614 are similar with the operations of the reading units 411-414, respectively. Therefore, some descriptions are not repeated for brevity.

In some embodiments, the reading unit 611 is configured to generate a data signal and transmit the data signal to a bit line BR1 based on the data stored in the memory cell 110, the reading unit 612 is configured to generate a data signal and transmit the data signal to the bit line BR1 based on the data stored in the memory cell 120, the reading unit 613 is configured to generate a data signal and transmit the data signal to a bit line BR2 based on the data stored in the memory cell 130, and the reading unit 614 is configured to generate a data signal and transmit the data signal to a bit line BR2 based on the data stored in the memory cell 140.

In some embodiments, the reading unit 611 includes switches T61 and T62. As illustratively shown in FIG. 6A, a control terminal of the switch T61 is coupled to a word line WR1, a terminal of the switch T61 is coupled to the bit line BR1, another terminal of the switch T61 is coupled to a node N61. A control terminal of the switch T62 is coupled to the node N14, a terminal of the switch T62 is coupled to the node N61, and another terminal of the switch T62 is configured to receive the reference voltage signal VDD.

In some embodiments, the reading unit 612 includes switches T63 and T64. As illustratively shown in FIG. 6A, a control terminal of the switch T63 is coupled to a word line WR2, a terminal of the switch T63 is coupled to the bit line BR1, another terminal of the switch T61 is coupled to a node N62. A control terminal of the switch T64 is coupled to the node N16, a terminal of the switch T64 is coupled to the node N62, and another terminal of the switch T64 is configured to receive the reference voltage signal VDD.

In some embodiments, the reading unit 613 includes switches T65 and T66. As illustratively shown in FIG. 6A, a control terminal of the switch T65 is coupled to a word line WR1, a terminal of the switch T65 is coupled to the bit line BR2, another terminal of the switch T65 is coupled to a node N63. A control terminal of the switch T66 is coupled to the node N18, a terminal of the switch T66 is coupled to the node N63, and another terminal of the switch T66 is configured to receive the reference voltage signal VDD.

In some embodiments, the reading unit 614 includes switches T67 and T68. As illustratively shown in FIG. 6A, a control terminal of the switch T67 is coupled to the word line WR2, a terminal of the switch T67 is coupled to the bit line BR2, another terminal of the switch T67 is coupled to a node N64. A control terminal of the switch T68 is coupled to the node N110, a terminal of the switch T68 is coupled to the node N64, and another terminal of the switch T68 is configured to receive the reference voltage signal VDD.

In some embodiments, the switches T61-T68 are implemented as PMOS transistors.

Figure 6B:
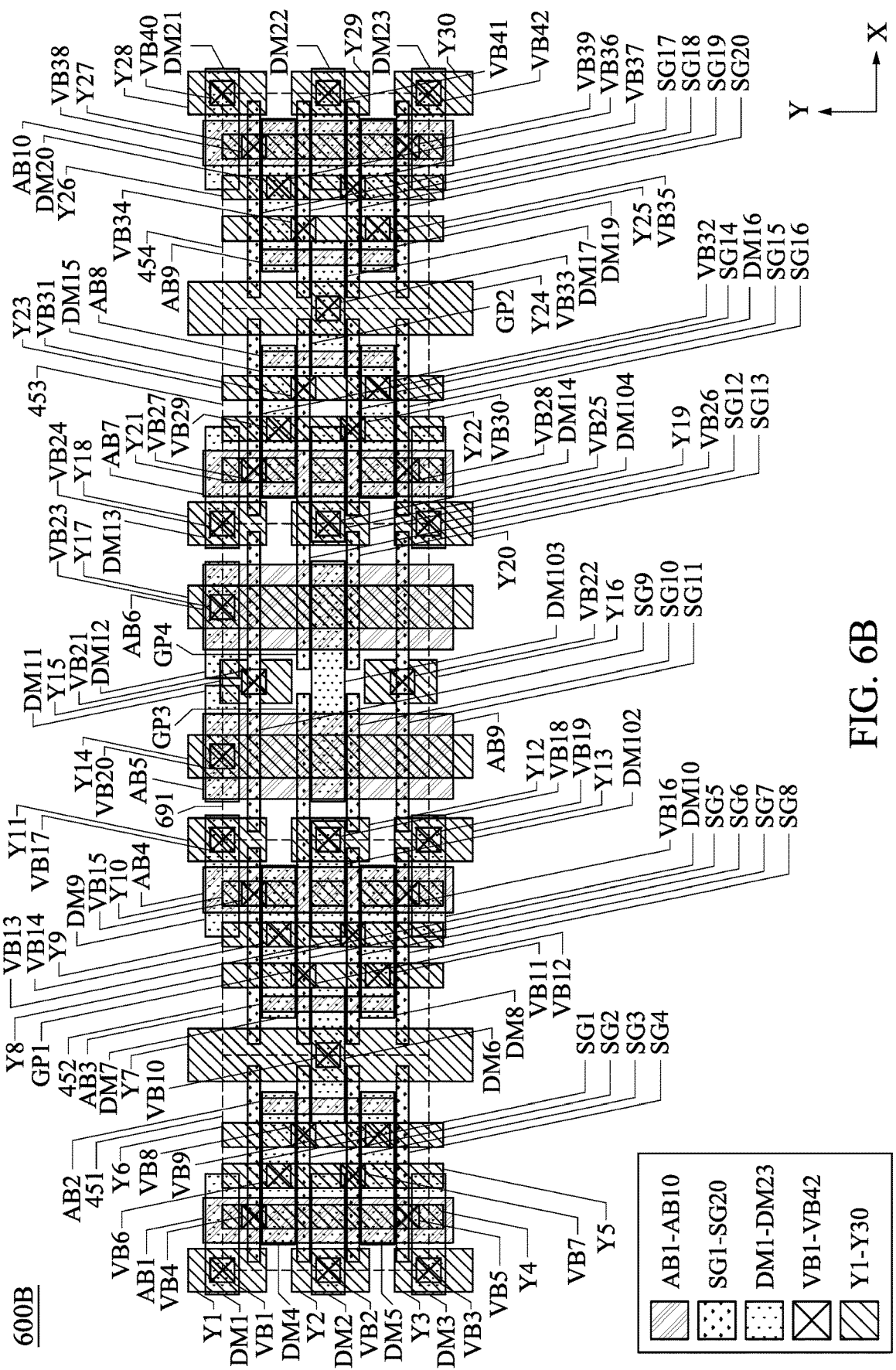
FIG. 6B is a schematic layout of an integrated circuit including structures corresponding to a portion of the memory device shown in FIG. 6A, in accordance with some embodiments of the present disclosure.

FIG. 6B is a schematic layout 600B of an integrated circuit including structures corresponding to a portion of the memory device 600A shown in FIG. 6A, in accordance with some embodiments of the present disclosure. For simplicity of illustration, the schematic layout 600B only shows a portion of structures, and the other portion of structures as can be known by one of ordinary skill in the art is not detailed in FIG. 6B.

For illustration of FIG. 6B with reference to FIG. 4B, the schematic layout 600B is similar to the schematic layout 400B. FIG. 6B follows a similar labeling convention to that of FIG. 4B. For brevity, the discussion will focus more on differences between FIG. 4B and FIG. 6B than on similarities.

As illustratively shown in FIG. 6B, the schematic layout 600B includes a reading circuit 691. The reading circuit 691 is arranged between and abutted with the memory cells 452 and 453. For illustration of FIG. 6B with reference to FIG. 6A, the reading circuit 691 corresponds to the reading circuit 610.

As illustratively shown in FIG. 6B, the schematic layout 600B further includes conductive segments DM102-DM104. In some embodiments, the conductive segments DM102-DM104 extend in the X direction and are separated from each other.

As illustratively shown in FIG. 6B, the conductive segment DM102 is crossing over the active area AB4. The active area AB4 is coupled to the conductive segment Y12 through the conductive segment DM102 and the via VB18. The conductive segment DM104 is crossing over the active area AB7. The active area AB7 is coupled to the conductive segment Y19 through the conductive segment DM104 and the via VB25. The conductive segment DM103 is crossing over and coupled to the active areas AB5 and AB6.

For illustration of FIG. 6B with reference to FIG. 6A, in some embodiments, the memory cells 110 and 130 are implemented as the memory cells 452 and 453, respectively. In such embodiments, the conductive segment DM102 is configured to transmit the reference voltage signal VSS from the conductive segments Y12 to the memory cell 452, and the conductive segment DM104 is configured to transmit the reference voltage signal VSS from the conductive segments Y19 to the memory cell 453. The resistor R13 is referred to as an equivalent resistor of at least the conductive segment Y13, DM102 and a via VB18. The resistor R15 is referred to as an equivalent resistor of at least the conductive segment Y19, DM104 and a via VB25.

For illustration of FIG. 6B with reference to FIG. 6A, in some embodiments, the reading circuit 610 is implemented as the reading circuit 691. In such embodiments, a gate terminal of the switch T64 corresponds to the gate portion GP3, a gate terminal of the switch T68 corresponds to the gate portion GP4, gate terminals of the switches T63 and T67 correspond to the gate structure SG9, a gate terminal of the switch T62 corresponds to the gate structure SG10, a gate terminal of the switch T66 corresponds to the gate structure SG13, gate terminals of the switches T61 and T65 correspond to the gate structure SG11. Source/drain terminals of the switches T61-T64 correspond to the active area AB5, and source/drain terminals of the switches T65-T68 correspond to the active area AB6. The conductive segment DM103 is configured to transmit the reference voltage signal VDD to the switches T62, T64, T66 and T68. The conductive segments Y14 and Y17 are coupled to the bit lines RB1 and RB2, respectively. The conductive segments Y15 and Y16 are coupled to the word lines WB1 and WB2, respectively.

Figure 7:
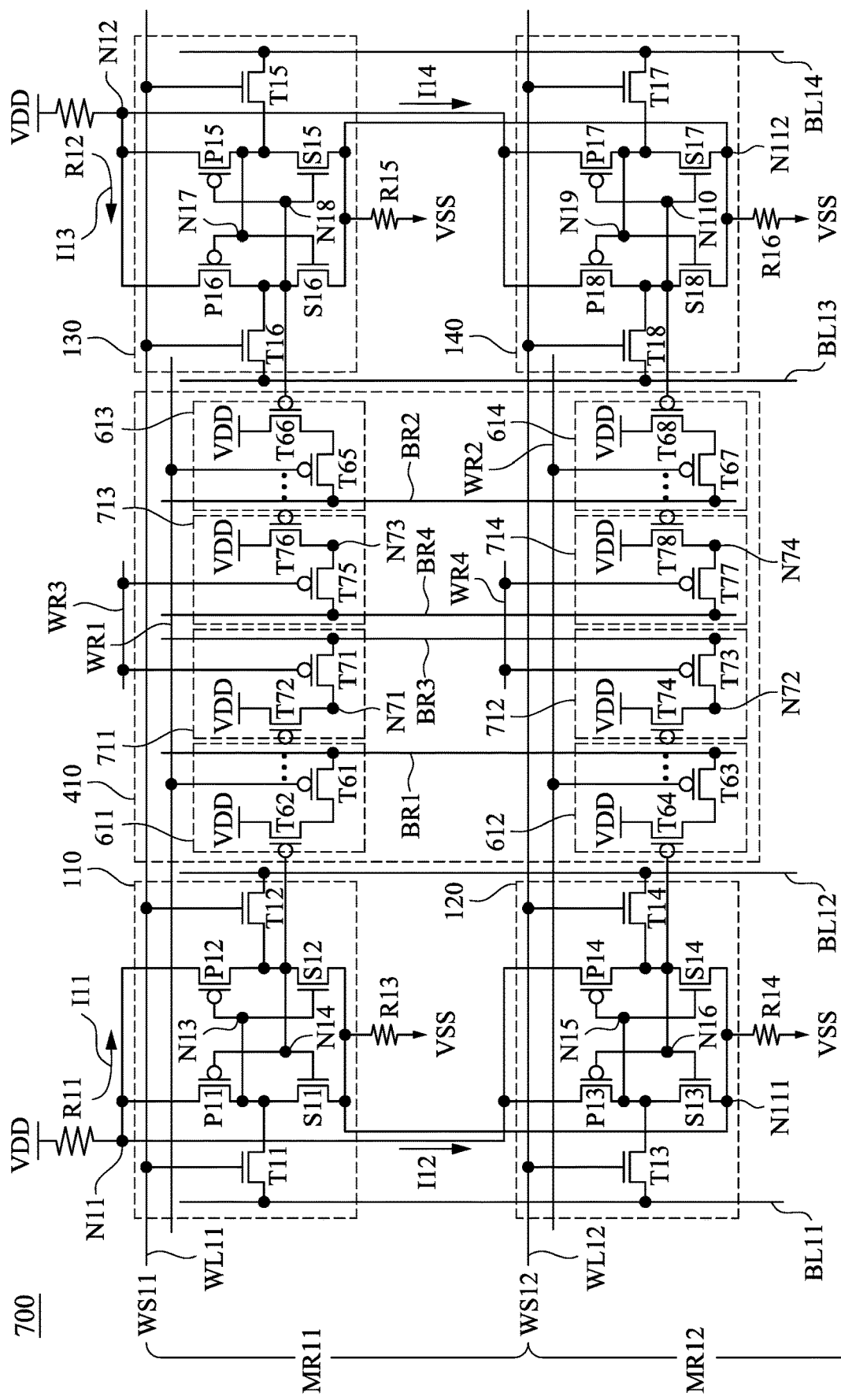
FIG. 7 is a circuit diagram of a memory device in accordance with some embodiments of the present disclosure.

FIG. 7 is a circuit diagram of a memory device 700 in accordance with some embodiments of the present disclosure. For illustration of FIG. 7 with reference to FIG. 6A, the memory device 700 is similar to the memory device 600A. FIG. 7 follows a similar labeling convention to that of FIG. 6A. For brevity, the discussion will focus more on differences between FIG. 6A and FIG. 7 than on similarities.

As illustratively shown in FIG. 7, the reading circuit 610 further includes reading units 711-714. In some embodiments, the reading unit 711 is configured to generate a data signal and transmit the data signal to a bit line RB3 based on the data stored in the memory cell 110, the reading unit 712 is configured to generate a data signal and transmit the data signal to the bit line RB3 based on the data stored in the memory cell 120, the reading unit 713 is configured to generate a data signal and transmit the data signal to a bit line RB4 based on the data stored in the memory cell 130, and the reading unit 714 is configured to generate a data signal and transmit the data signal to a bit line RB4 based on the data stored in the memory cell 140.

In some embodiments, the reading unit 711 includes switches T71 and T72. As illustratively shown in FIG. 7, a control terminal of the switch T71 is coupled to a word line WR3, a terminal of the switch T71 is coupled to the bit line BR3, another terminal of the switch T71 is coupled to a node N71. A control terminal of the switch T72 is coupled to the node N14, a terminal of the switch T72 is coupled to the node N71, and another terminal of the switch T72 is configured to receive the reference voltage signal VDD.

In some embodiments, the reading unit 712 includes switches T73 and T74. As illustratively shown in FIG. 7, a control terminal of the switch T73 is coupled to a word line WR4, a terminal of the switch T73 is coupled to the bit line BR3, another terminal of the switch T71 is coupled to a node N72. A control terminal of the switch T74 is coupled to the node N17, a terminal of the switch T74 is coupled to the node N72, and another terminal of the switch T74 is configured to receive the reference voltage signal VDD.

In some embodiments, the reading unit 713 includes switches T75 and T76. As illustratively shown in FIG. 7, a control terminal of the switch T75 is coupled to a word line WR3, a terminal of the switch T75 is coupled to the bit line BR4, another terminal of the switch T75 is coupled to a node N73. A control terminal of the switch T76 is coupled to the node N18, a terminal of the switch T76 is coupled to the node N73, and another terminal of the switch T76 is configured to receive the reference voltage signal VDD.

In some embodiments, the reading unit 714 includes switches T77 and T78. As illustratively shown in FIG. 7, a control terminal of the switch T77 is coupled to the word line WR4, a terminal of the switch T77 is coupled to the bit line BR4, another terminal of the switch T77 is coupled to a node N74. A control terminal of the switch T78 is coupled to the node N110, a terminal of the switch T78 is coupled to the node N74, and another terminal of the switch T78 is configured to receive the reference voltage signal VDD.

In some embodiments, the switches T71-T78 are implemented as PMOS transistors. In various embodiments, the reading circuit 610 further includes various reading units coupled to one of the nodes N14, N16, N18, N110, and configured to generate data signals based on data stored in corresponding one of the memory cells 110, 120, 130 and 140.

Figure 8:
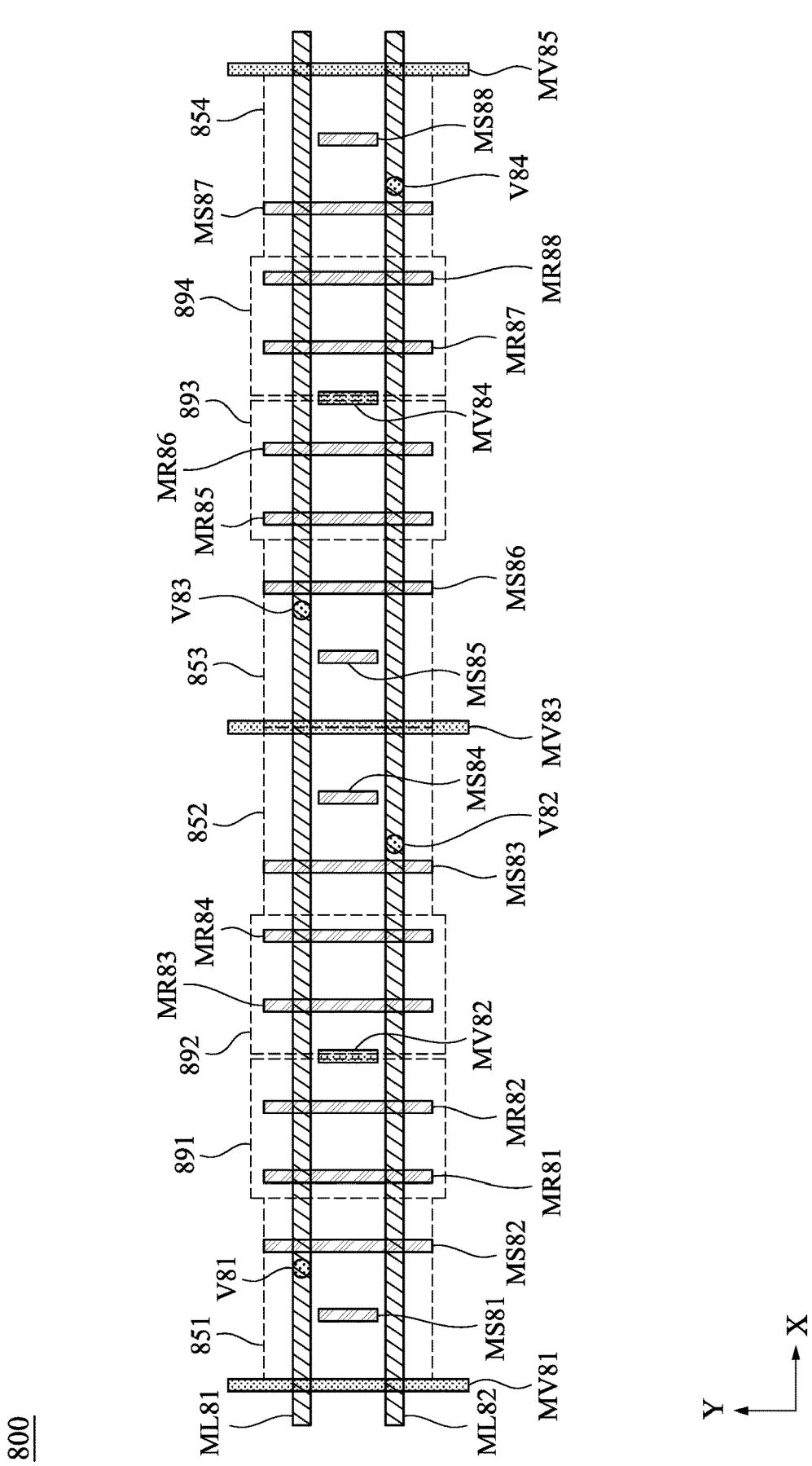
FIG. 8 is a schematic layout of an integrated circuit including structures corresponding to a portion of the memory device shown in FIG. 4A, in accordance with some embodiments of the present disclosure.

FIG. 8 is a schematic layout 800 of an integrated circuit including structures corresponding to a portion of the memory device 400A shown in FIG. 4A, in accordance with some embodiments of the present disclosure. For simplicity of illustration, the schematic layout 800 only shows a portion of structures, and the other portion of structures as can be known by one of ordinary skill in the art is not detailed in FIG. 8.

As illustratively shown in FIG. 8, the schematic layout 800 includes memory cells 852 and 853 arranged in the X direction in order. In some embodiments, the memory cell 852 is abutted with the memory cell 853. In some embodiments, the memory cell 852 includes active areas MS83 and MS84, and the memory cell 853 includes active areas MS85 and MS86. As illustratively shown in FIG. 8, the active areas MS83-MS86 extend in the Y direction.

As illustratively shown in FIG. 8, the schematic layout 800 further includes conductive lines ML81, ML82, vias V82, V83 and conductive segment MV83. The conductive segment MV83 is disposed at a boundary between the memory cells 852 and 853, and extends in the Y direction. Each of the conductive lines ML81, ML82 extends in the X direction and is crossing over the active areas MS83, MS86 and the conductive segment MV83. The via V82 is configured to couple the memory cell 852 to the conductive line ML82, and the via V83 is configured to couple the memory cell 853 to the conductive line ML81.

For illustration of FIG. 8 with reference to FIG. 4A, in some embodiments, the memory cells 110 and 120 are implemented as the memory cells 852 and 853, respectively. In such embodiments, the conductive segment MV83 is configured to transmit the reference voltage signal VDD to the active areas MS84 and MS85. The word line WL11 is implemented as the conductive line ML82 and transmits the word line signal WS11 to the memory cell 852. The word line WL12 is implemented as the conductive line ML81 and transmits the word line signal WS12 to the memory cell 853. The active areas MS83 and MS86 are configured to receive the reference voltage signal VSS.

In some embodiments, the schematic layout 800 further includes reading devices 893, 894 and the memory cell 854 arranged in the X direction in order. In some embodiments, the reading device 893 is abutted with and arranged between the memory cell 853 and the reading device 894, and the reading device 894 is abutted with and arranged between the memory cell 854 and the reading device 893. In some embodiments, the reading devices 893 and 894 are configured to read data from the memory cells 853 and 854, respectively.

In some embodiments, the memory cell 854 includes active areas MS87 and MS88. The reading device 893 includes active areas MR85 and MR86. The reading device 894 includes active areas MR87 and MR88. As illustratively shown in FIG. 8, the active areas MR85-MR88, MS87 and MS88 extend in the Y direction.

As illustratively shown in FIG. 8, the schematic layout 800 further includes a via V84 and conductive segments MV84, MV85. The conductive segment MV85 is disposed at a boundary of the memory cell 854. The conductive segment MV84 is disposed at a boundary between the reading devices 893 and 894. The conductive segments MV84, MV85 extend in the X direction. Each of the conductive lines ML81, ML82 is further crossing over the active areas MR85-MR88, MS87, MS88 and the conductive segment MV85. The via V84 is configured to couple the memory cell 854 to the conductive line ML82.

For illustration of FIG. 8 with reference to FIG. 4A, in some embodiments, the memory cell 130 is implemented as the memory cell 854. In such embodiments, the conductive segment MV85 is configured to transmit the reference voltage signal VDD to the active area MS88. The word line WL11 is implemented as the conductive line ML82 and transmits the word line signal WS11 to the memory cell 854. The conductive segment MV84 is configured to transmit the reference voltage signal VSS to the active areas MR85-MR88.

In some embodiments, the schematic layout 800 further includes the memory cell 851 and reading devices 891, 892 arranged in the X direction in order. In some embodiments, the reading device 891 is abutted with and arranged between the memory cell 851 and the reading device 892, and the reading device 892 is abutted with and arranged between the memory cell 852 and the reading device 891. In some embodiments, the reading devices 891 and 892 are configured to read data from the memory cells 851 and 852, respectively.

In some embodiments, the memory cell 851 includes active areas MS81 and MS82. The reading device 891 includes active areas MR81 and MR82. The reading device 892 includes active areas MR83 and MR84. As illustratively shown in FIG. 8, the active areas MR81-MR84, MS81 and MS82 extend in the Y direction.

As illustratively shown in FIG. 8, the schematic layout 800 further includes a via V81 and conductive segments MV81, MV82. The conductive segment MV81 is disposed at a boundary of the memory cell 851. The conductive segment MV82 is disposed at a boundary between the reading devices 891 and 892. The conductive segments MV81, MV82 extend in the X direction. Each of the conductive lines ML81, ML82 is further crossing over the active areas MR81-MR84, MS81, MS82 and the conductive segment MV81. The via V81 is configured to couple the memory cell 851 to the conductive line ML81.

For illustration of FIG. 8 with reference to FIG. 4A, in some embodiments, the memory cell 140 is implemented as the memory cell 851. In such embodiments, the conductive segment MV81 is configured to transmit the reference voltage signal VDD to the active area MS81. The word line WL12 is implemented as the conductive line ML81 and transmits the word line signal WS12 to the memory cell 851.

The conductive segment MV82 is configured to transmit the reference voltage signal VSS to the active areas MR81-MR84.

Also disclosed is a memory device that includes a first conductive segment, a first row of memory cells and a second row of memory cells. The first conductive segment is configured to receive a first reference voltage signal. The first row of memory cells is coupled to a first word line. The second row of memory cells is coupled to a second word line different from the first word line. The first row of memory cells includes a first memory cell and a second memory cell. The first memory cell is coupled to the first conductive segment to receive the first reference voltage signal. The second row of memory cells includes a third memory cell and a fourth memory cell. The third memory cell is coupled to the first conductive segment to receive the first reference voltage signal. The first memory cell and the third memory cell share the first conductive segment, and the third memory cell is arranged between the first memory cell and the second memory cell. The second memory cell is arranged between the third memory cell and the fourth memory cell.

Also disclosed is a memory device that includes a first memory cell, a second memory cell, a first conductive segment, a first word line and a second word line. The first memory cell includes a first active area, a second active area and a first gate structure. The first gate structure is arranged across the first active area. The second memory cell includes a third active area, a fourth active area and a second gate structure. The second gate structure is arranged across the third active area. The first conductive segment is arranged across the second active area and the fourth active area, and is configured to transmit a first reference voltage signal to the second active area and the fourth active area. The first word line is arranged over the first active area and the third active area, and is coupled to the first gate structure. The second word line is separated from the first word line, is arranged over the first active area and the third active area, and is coupled to the second gate structure.

Also disclosed is a method for manufacturing a memory device. The method includes: disposing a first memory cell, a second memory cell, a third memory cell and a fourth memory cell along a first direction; coupling a first word line extending in the first direction to the first memory cell and the second memory cell; coupling a second word line extending in the first direction to the third memory cell and the fourth memory cell; disposing a first conductive segment extending in a second direction different from the first direction at a boundary between the first memory cell and the third memory cell; and coupling the first conductive segment to the first memory cell and the third memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a first conductive segment configured to receive a first reference voltage signal;
    a first row of memory cells coupled to a first word line;
    a second row of memory cells coupled to a second word line different from the first word line,
    wherein the first row of memory cells comprises:
        a first memory cell coupled to the first conductive segment to receive the first reference voltage signal; and
        a second memory cell, and wherein the second row of memory cells comprises:
        a third memory cell coupled to the first conductive segment to receive the first reference voltage signal, wherein the first memory cell and the third memory cell share the first conductive segment, and the third memory cell is arranged between the first memory cell and the second memory cell;
        a fourth memory cell, wherein the second memory cell is arranged between the third memory cell and the fourth memory cell; and
        a second conductive segment extending in a first direction, and configured to couple the first memory cell and the third memory cell to the first conductive segment,
        wherein the first conductive segment extends in a second direction different from the first direction.

2. The memory device of claim 1, further comprising:
    a third conductive segment disposed at a boundary between the second memory cell and the fourth memory cell, and configured to receive the first reference voltage signal,
    wherein the second memory cell is coupled to the third conductive segment to receive the first reference voltage signal, and
    the fourth memory cell is coupled to the first conductive segment to receive the first reference voltage signal.

3. The memory device of claim 1, further comprising:
    a first via configured to couple the first word line to the first memory cell; and
    a second via configured to couple the second word line to the third memory cell,
    wherein the first via and the second via are separated in the first direction and are separated in the second direction.

4. The memory device of claim 1, wherein the second row of memory cells and the first row of memory cells are activated in order, and
    a current passing through the first memory cell is larger than a current passing through the third memory cell when the first row of memory cells is activated.

5. The memory device of claim 1, wherein the third memory cell is abutted with the first memory cell and the second memory cell, and the second memory cell is abutted with the fourth memory cell and the third memory cell.

6. A memory device, comprising:
    a first memory cell comprising:
        a first active area;
        a second active area;
        a first gate structure arranged across the first active area;
    a second memory cell comprising:
        a third active area;
        a fourth active area;
        a second gate structure arranged across the third active area;
    a first conductive segment arranged across the second active area and the fourth active area, and configured to transmit a first reference voltage signal to the second active area and the fourth active area;

a first word line arranged over the first active area and the third active area, and coupled to the first gate structure; and a second word line separated from the first word line, arranged over the first active area and the third active area, and coupled to the second gate structure.

7. The memory device of claim 6, further comprising:
a second conductive segment arranged across the first conductive segment, extending in a first direction, and disposed between the second active area and the fourth active area,
wherein the first conductive segment extends in a second direction different from the first direction.

8. The memory device of claim 6, further comprising:
a second conductive segment arranged across the first active area, and configured to provide a second reference voltage signal different from the first reference voltage signal to the first active area; and
a third conductive segment separated from the second conductive segment, arranged across the third active area, and configured to provide the second reference voltage signal to the third active area.

9. The memory device of claim 8, further comprising:
a third memory cell comprising:
a fifth active area; and
a third gate structure arranged across the fifth active area and coupled to the second word line,
wherein the second memory cell is disposed between the first memory cell and the third memory cell.

10. The memory device of claim 9, further comprising:
a reading circuit arranged between and abutted with the second memory cell and the third memory cell, wherein the reading circuit is configured to read data stored in the first memory cell, the second memory cell and the third memory cell.

11. The memory device of claim 10, further comprising:
a second conductive segment arranged across the reading circuit, and configured to transmit a second reference signal different from the first reference voltage signal to the reading circuit, the second memory cell and the third memory cell.

12. The memory device of claim 10, further comprising:
a second conductive segment arranged across the reading circuit, and configured to transmit the first reference voltage signal to the reading circuit.

13. The memory device of claim 10, wherein the reading circuit shares a first gate structure with the second memory cell and shares a second gate structure with the third memory cell, and
the first gate structure is arranged over the third active area and the fourth active area, and the second gate structure is arranged over the fifth active area.

14. The memory device of claim 9, further comprising:
a fourth memory cell comprising:
a sixth active area; and
a fourth gate structure arranged across the sixth active area and coupled to the first word line,
wherein the third memory cell is disposed between the second memory cell and the fourth memory cell.

15. The memory device of claim 14, further comprising:
a fourth conductive segment disposed between the fifth active area and the sixth active area, and configured to provide the first reference voltage signal to the third memory cell and the fourth memory cell.

16. A method for manufacturing a memory device, comprising:
disposing a first memory cell, a second memory cell, a third memory cell and a fourth memory cell along a first direction;
coupling a first word line extending in the first direction to the first memory cell and the second memory cell;
coupling a second word line extending in the first direction to the third memory cell and the fourth memory cell;
disposing a first conductive segment extending in a second direction different from the first direction at a boundary between the first memory cell and the third memory cell;
coupling the first conductive segment to the first memory cell and the third memory cell;
disposing a reading circuit between the second memory cell and the third memory cell;
arranging a second conductive segment across the reading circuit; and
coupling the second conductive segment to the second memory cell and the third memory cell,
wherein the first memory cell, the third memory cell, the second memory cell and the fourth memory cell are arranged in order along the first direction.

17. The method of claim 16, further comprising:
disposing a third conductive segment extending in the second direction at a boundary between the second memory cell and the fourth memory cell; and
coupling the third conductive segment to the second memory cell and the fourth memory cell,
wherein the reading circuit is abutted with the second memory cell and the third memory cell, and
the second conductive segment extends in the first direction across the reading circuit.

18. The method of claim 17, further comprising:
the reading circuit and the second memory cell sharing a first gate structure extending in the first direction; and
the reading circuit and the third memory cell sharing a second gate structure extending in the first direction and separated from the first gate structure.

19. The method of claim 16,
wherein the reading circuit is abutted with the second memory cell and the third memory cell, and
the second conductive segment extends the first direction across the reading circuit.

20. The method of claim 16, wherein the reading circuit and the second memory cell sharing a first gate structure extending in the first direction.

* * * * *